United States Patent
Machida

(10) Patent No.: US 10,907,908 B2
(45) Date of Patent: Feb. 2, 2021

(54) COOLER

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 56 days.

(21) Appl. No.: 16/535,349

(22) Filed: Aug. 8, 2019

(65) Prior Publication Data

US 2020/0064077 A1    Feb. 27, 2020

(30) Foreign Application Priority Data

Aug. 27, 2018  (JP) .................................. 2018-158700

(51) Int. Cl.
    *F28D 15/00*   (2006.01)
    *F28D 15/02*   (2006.01)
    *F25D 3/06*    (2006.01)

(52) U.S. Cl.
    CPC .......... *F28D 15/0275* (2013.01); *F25D 3/06* (2013.01); *F28D 15/0266* (2013.01)

(58) Field of Classification Search
    CPC ..... F28D 15/0275; F25D 3/06; F25D 15/0266
    USPC .................................................. 165/104.21
    See application file for complete search history.

(56) References Cited

U.S. PATENT DOCUMENTS

| 8,780,560 | B2 * | 7/2014 | Ogata | F28D 15/046 |
| | | | | 361/700 |
| 2013/0112375 | A1 * | 5/2013 | Choi | F28D 15/046 |
| | | | | 165/104.26 |
| 2014/0144609 | A1 * | 5/2014 | Choi | B22F 5/106 |
| | | | | 165/104.26 |
| 2018/0058767 | A1 | 3/2018 | Machida et al. | |

FOREIGN PATENT DOCUMENTS

| CN | 109579585 | 4/2019 |
| JP | 2018-036012 | 3/2018 |
| JP | 2018-076978 | 5/2018 |

\* cited by examiner

*Primary Examiner* — Davis D Hwu
(74) *Attorney, Agent, or Firm* — IPUSA, PLLC

(57) ABSTRACT

A cooler includes a plurality of loop heat pipes. Each of the plurality of loop heat pipes includes an evaporator that vaporizes a working fluid, a condenser that liquefies the working fluid, a liquid pipe that connects the evaporator and the condenser, and a vapor pipe that connects the evaporator and the condenser, and forms a loop-shaped passage together with the liquid pipe. Evaporators of the plurality of loop heat pipes overlap each other, and a pressure inside the loop-shaped passage is different among the plurality of loop heat pipes.

15 Claims, 21 Drawing Sheets

COOLER

CROSS-REFERENCE TO RELATED APPLICATION

This application is based upon and claims priority to Japanese Patent Application No. 2018-158700, filed on Aug. 27, 2018, the entire contents of which are incorporated herein by reference.

FIELD

Certain aspects of the embodiments discussed herein are related to a cooler.

BACKGROUND

A heat pipe is a known device for cooling a heat-generating component, such as a Central Processing Unit (CPU) or the like, that is provided in electronic devices. The heat pipe utilizes a phase change of a working fluid to transfer heat.

A loop heat pipe is an example of the heat pipe, and includes an evaporator that vaporizes a working fluid by the heat of the heat-generating component, and a condenser that liquefies the vaporized working fluid. The evaporator and the condenser are connected by a loop-shaped passage that is formed by a liquid pipe and a vapor pipe. In the loop heat pipe, the working fluid flows through the loop-shaped passage in one direction.

In addition, a porous body is provided inside the liquid pipe of the loop heat pipe, and the working fluid inside the liquid pipe is guided to the evaporator due to the capillary force generated in the porous body, to restrict the backflow of vapor from the evaporator to the liquid pipe. The porous body is formed by laminating a plurality of metal layers respectively formed with a large number of pores. An example of such a structure is described in Japanese Laid-Open Patent Publication No. 2018-036012 (Japanese Patent No. 6291000), for example.

Further, a technique has been proposed to transfer heat from a plurality of heat-generating components by a single loop heat pipe that is formed by laminating a plurality of metal sheets. An example of such a technique is described in Japanese Laid-Open Patent Publication No. 2018-76978, for example.

However, although the loop heat pipe that is formed by a plurality of laminated metal layers is preferable from a viewpoint of reducing the thickness of the loop heat pipe, it may be difficult in some cases to obtain a sufficiently high heat transfer performance.

SUMMARY

Accordingly, it is an object in one aspect of the embodiments to provide a cooler which can improve the heat transfer performance.

According to one aspect of the embodiments, a cooler includes a plurality of loop heat pipes, wherein each of the plurality of loop heat pipes includes an evaporator configured to vaporize a working fluid, a condenser configured to liquefy the working fluid, a liquid pipe that connects the evaporator and the condenser, and a vapor pipe that connects the evaporator and the condenser, and forms a loop-shaped passage together with the liquid pipe, wherein evaporators of the plurality of loop heat pipes overlap each other, and wherein a pressure inside the loop-shaped passage is different among the plurality of loop heat pipes.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
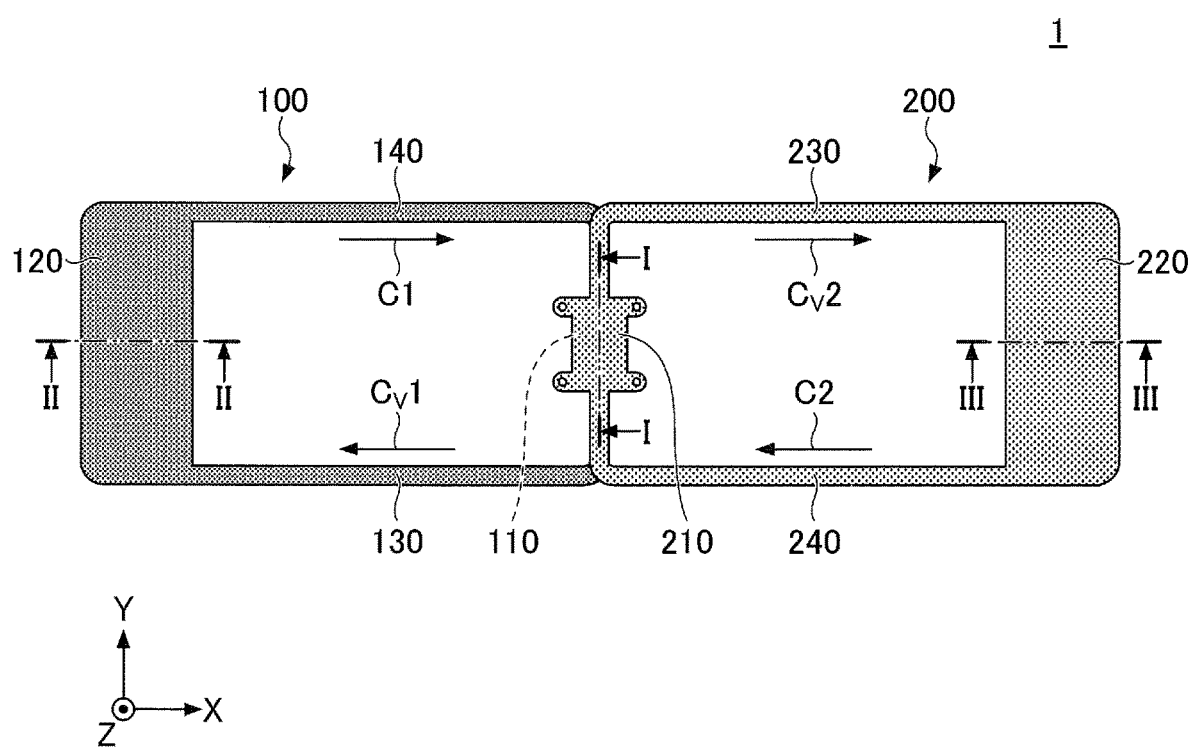
FIG. 1 is a plan view schematically illustrating a cooler according to a first embodiment.

Preferred embodiments of the present invention will be described with reference to the accompanying drawings. In the drawings, those parts that are the same are designated by the same reference numerals, and a repeated description of the same parts may be omitted.

A description will now be given of a cooler in each embodiment according to the present invention.

First Embodiment

Figure 2:
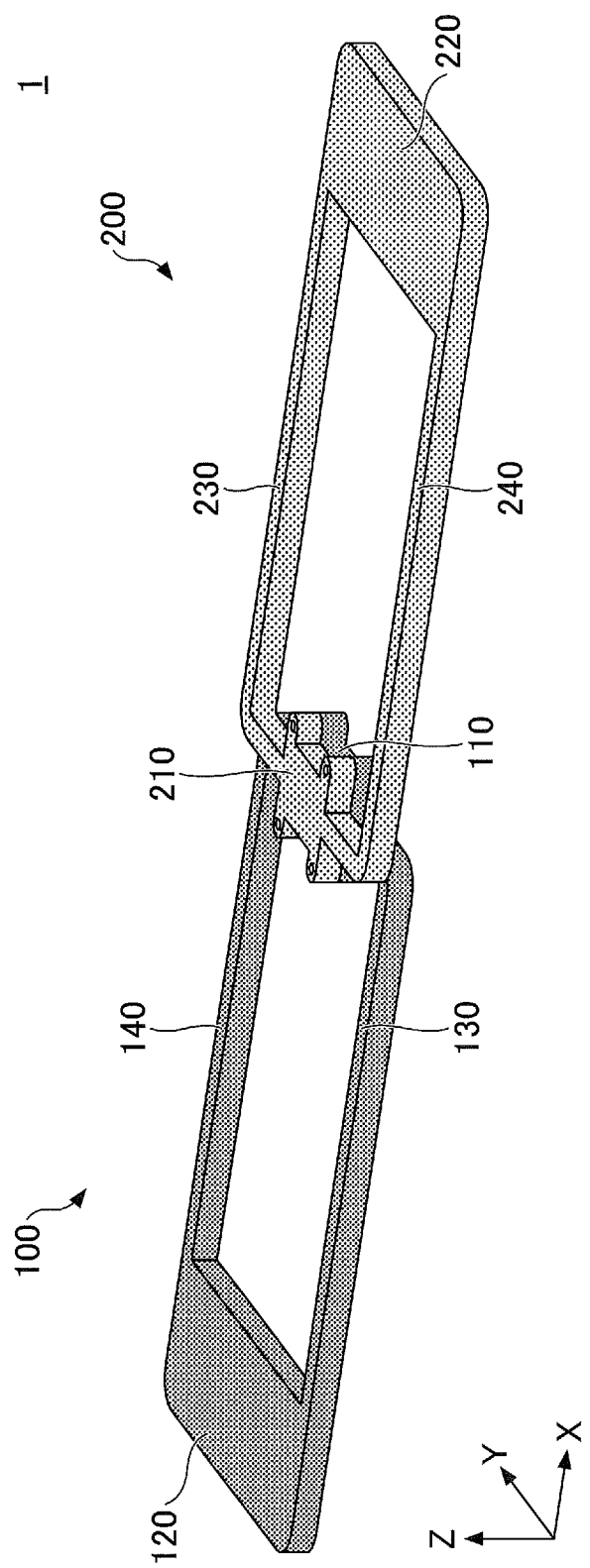
FIG. 2 is a perspective view schematically illustrating the cooler according to the first embodiment.
Figure 3A:
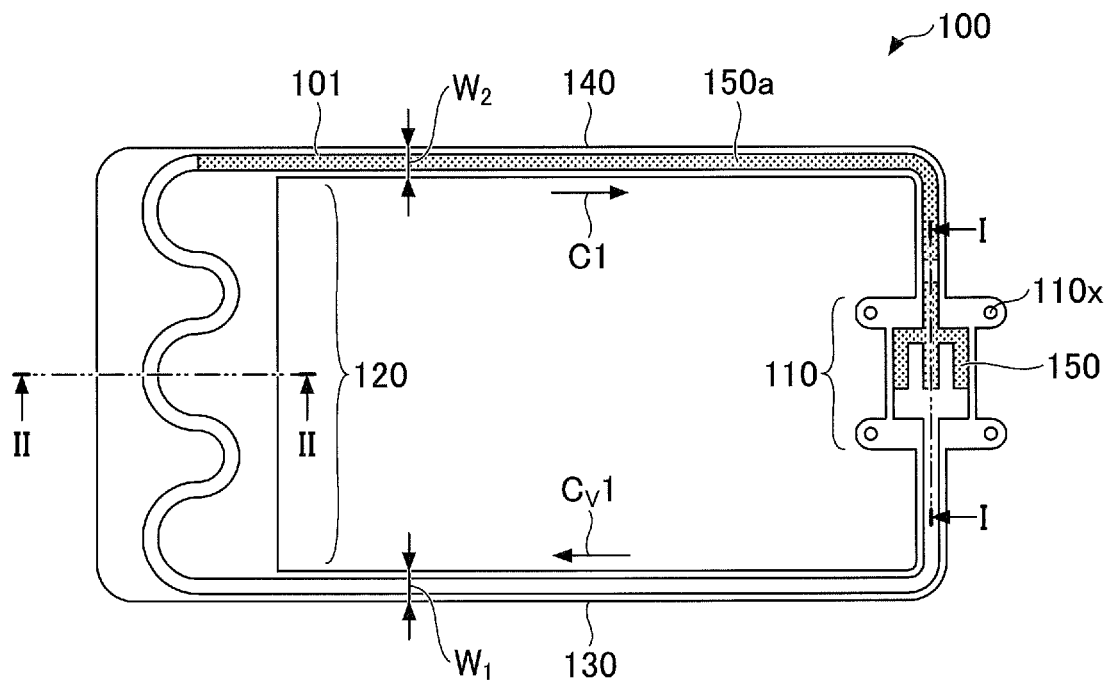
FIG. 3A and FIG. 3B are plan views schematically illustrating loop heat pipes included in the cooler according to the first embodiment.
Figure 3B:
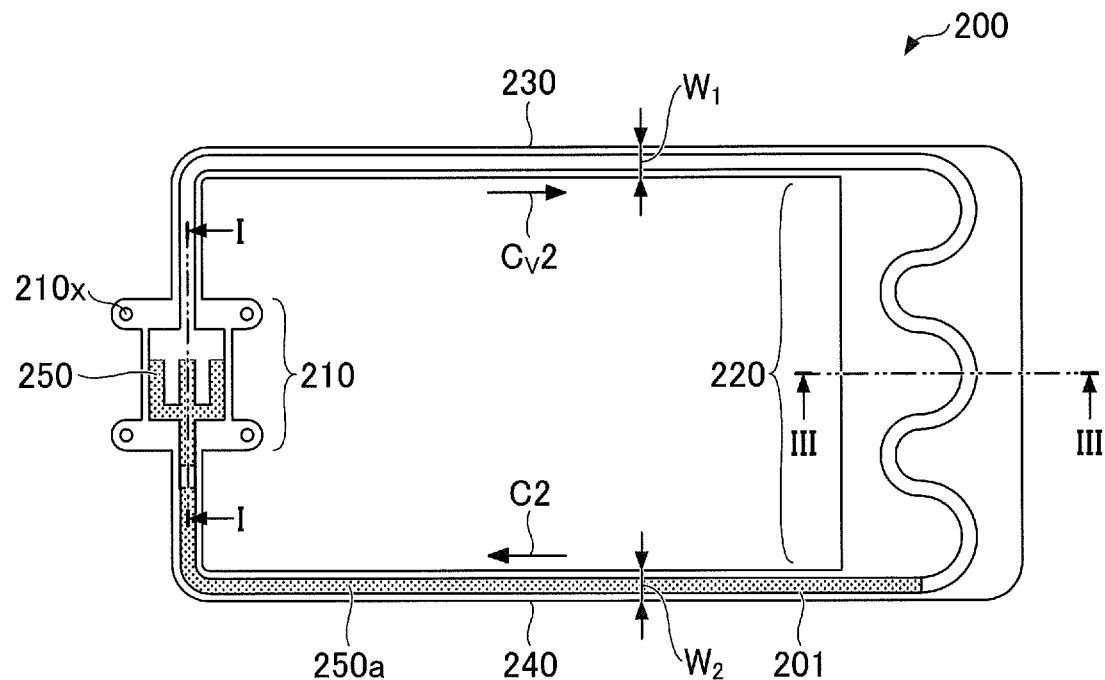

First, a first embodiment will be described. A cooler according to the first embodiment includes two loop heat pipes. FIG. 1 is a plan view schematically illustrating the cooler according to the first embodiment. FIG. 2 is a perspective view schematically illustrating the cooler according to the first embodiment. FIG. 3A and FIG. 3B are plan views schematically illustrating the loop heat pipes included in the cooler according to the first embodiment. In FIG. 3A and FIG. 3B, however, the illustration of metal layers (metal layers 151 and 251 illustrated in FIG. 5) forming one of outermost layers is omitted.

As illustrated in FIG. 1 and FIG. 2, a cooler 1 according to the first embodiment includes a loop heat pipe 100 and a loop heat pipe 200. The cooler 1 may be accommodated in a mobile electronic apparatus, such as a smartphone, a tablet terminal, or the like, for example.

Figure 5:
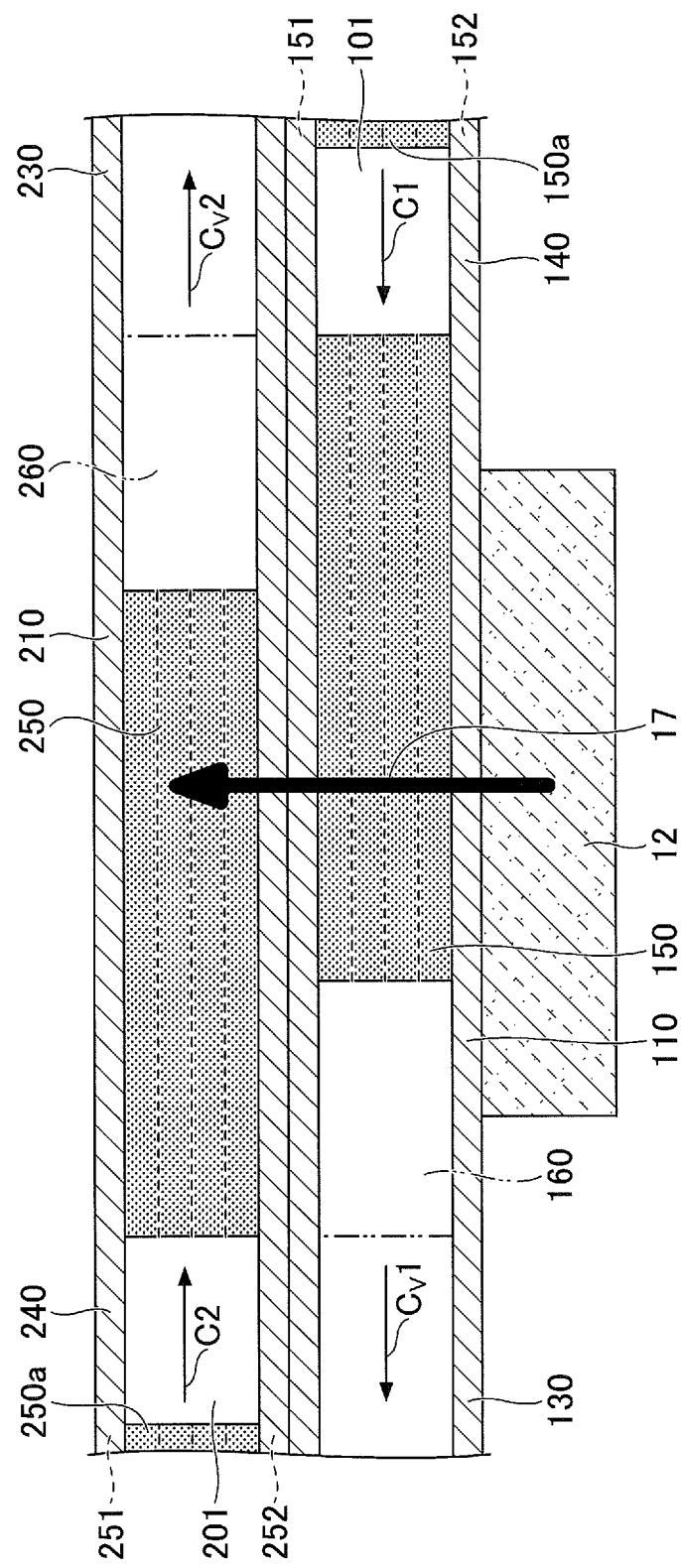
FIG. 5 is a cross sectional view illustrating the cooler according to the first embodiment.

As illustrated in FIG. 3A, the loop heat pipe 100 includes an evaporator 110, a condenser 120, a vapor pipe 130, and a liquid pipe 140. The evaporator 110, the condenser 120, the vapor pipe 130, and the liquid pipe 140 may be formed by a structure in which a plurality of metal layers are laminated as illustrated in FIG. 5, for example. The metal layers are copper layers having a high thermal conductivity, for example, and the metal layers are directly bonded to each other by solid-phase (or solid-state) bonding or the like. Each of the metal layers may have a thickness of approximately 50 μm to approximately 200 μm, for example.

Of course, the metal layers of the loop heat pipe 100 are not limited to the copper layers, and may be stainless steel layers, aluminum layers, magnesium alloy layers, or the like, for example. In addition, the number of metal layers that are laminated is not limited to a particular number.

As illustrated in FIG. 3A, a porous body 150 having a comb shape in the plan view, for example, is provided inside the evaporator 110. For example, the porous body 150 is integrally formed to make contact with a pipe wall. In addition, a porous body 150a is also provided inside the liquid pipe 140. The porous body 150 and the porous body 150a include a plurality of pores (not illustrated) formed in the metal layers between the two metal layers 151 and 152 forming the outermost layers of the above mentioned plurality of metal layers, for example.

In the loop heat pipe 100, the evaporator 110 has a function to vaporize a working fluid C1 to generate vapor Cv1. The condenser 120 has a function to liquefy the vapor Cv1 of the working fluid C1. The evaporator 110 and the condenser 120 are connected via the vapor pipe 130 and the liquid pipe 140, and the vapor pipe 130 and the liquid pipe 140 form a loop-shaped passage 101 in which the working fluid C1 or the vapor Cv1 flows.

An inlet (not illustrated) is provided in the liquid pipe 140, and the working fluid C1 is filled into the liquid pipe 140 through the inlet. After filling the working fluid C1 into the liquid pipe 140, the inlet is sealed by a sealing member (not illustrated), for example.

As illustrated in FIG. 3B, the loop heat pipe 200 includes an evaporator 210, a condenser 220, a vapor pipe 230, and a liquid pipe 240. The evaporator 210, the condenser 220, the vapor pipe 230, and the liquid pipe 240 may be formed by a structure in which a plurality of metal layers are laminated as illustrated in FIG. 5, for example. The metal layers are copper layers having a high thermal conductivity, for example, and the metal layers are directly bonded to each other by solid-phase (or solid-state) bonding or the like. Each of the metal layers may have a thickness of approximately 50 μm to approximately 200 μm, for example.

Of course, the metal layers of the loop heat pipe 200 are not limited to the copper layers, and may be stainless steel layers, aluminum layers, magnesium alloy layers, or the like, for example. In addition, the number of metal layers that are laminated is not limited to a particular number.

As illustrated in FIG. 3B, a porous body 250 having a comb shape in the plan view, for example, is provided inside the evaporator 210. For example, the porous body 250 is integrally formed to make contact with a pipe wall. In addition, a porous body 250a is also provided inside the liquid pipe 240. The porous body 250 and the porous body 250a include a plurality of pores (not illustrated) formed in the metal layers between the two metal layers 251 and 252 forming the outermost layers of the above mentioned plurality of metal layers, for example.

In the loop heat pipe 200, the evaporator 210 has a function to vaporize a working fluid C2 to generate vapor Cv2. The condenser 220 has a function to liquefy the vapor Cv2 of the working fluid C2. The evaporator 210 and the condenser 220 are connected via the vapor pipe 230 and the liquid pipe 240, and the vapor pipe 230 and the liquid pipe 240 form a loop-shaped passage 201 in which the working fluid C2 or the vapor Cv2 flows.

An inlet (not illustrated) is provided in the liquid pipe 240, and the working fluid C2 is filled into the liquid pipe 240 through the inlet. After filling the working fluid C2 into the liquid pipe 240, the inlet is sealed by a sealing member (not illustrated), for example.

The vapor pipes 130 and 230 may have a width $W_1$ of approximately 8 mm, for example. In addition, the liquid pipes 140 and 240 may have a width $W_2$ of approximately 6 mm, for example. Of course, the width $W_1$ of the vapor pipes 130 and 230 and the width $W_2$ of the liquid pipes 140 and 240 are not limited to the above mentioned values, and the widths $W_1$ and $W_2$ may be the same.

As illustrated in FIG. 1 and FIG. 2, in the cooler 1, an upper surface of the evaporator 110 makes direct contact with a lower surface of the evaporator 210, and the evaporators 110 and 210 overlap each other.

On the other hand, the condensers 120 and 220 are arranged so that the evaporators 110 and 210 are positioned between the condensers 120 and 220 in the plan view. In other words, when viewed from the evaporators 110 and 210 which are regarded as the center of the view, the condensers 120 and 220 are arranged at symmetrical positions along the X-direction.

In addition, when viewed from the evaporators 110 and 210 which are regarded as the center of the view, the vapor pipe 130 and the liquid pipe 240 are arranged at symmetrical positions along the X-direction, and the liquid pipe 140 and the vapor pipe 230 are arranged at symmetrical positions along the X-direction.

The positional relationship of each of the evaporators 110 and 210, the condensers 120 and 220, the vapor pipes 130 and 230, and the liquid pipes 140 and 240 are not limited to the above mentioned positional relationship, and may be appropriately set to other positional relationships. For example, the metal layers may be laminated so that, when viewed from the evaporators 110 and 210 which are regarded as the center of the view, the vapor pipe 130 and the vapor pipe 230 are arranged at symmetrical positions along the X-direction, and the liquid pipe 140 and the liquid pipe 240 are arranged at symmetrical positions along the X-direction.

In FIG. 1, FIG. 2, FIG. 3A, and FIG. 3B, a direction in which the condenser 220 is positioned when viewed from the evaporators 110 and 210 is referred to as the +X-direction. In addition, a direction in which the liquid pipe 140 is positioned when viewed from the vapor pipe 130 is referred to as the +Y-direction. A direction in which the loop heat pipe 200 is laminated on the upper surface of the loop heat pipe 100 (on the metal layer 151 illustrated in FIG. 5) when viewed from the loop heat pipe 100 is referred to as the +Z-direction. The same designations of the directions are also used in the figures described below.

Figure 4:
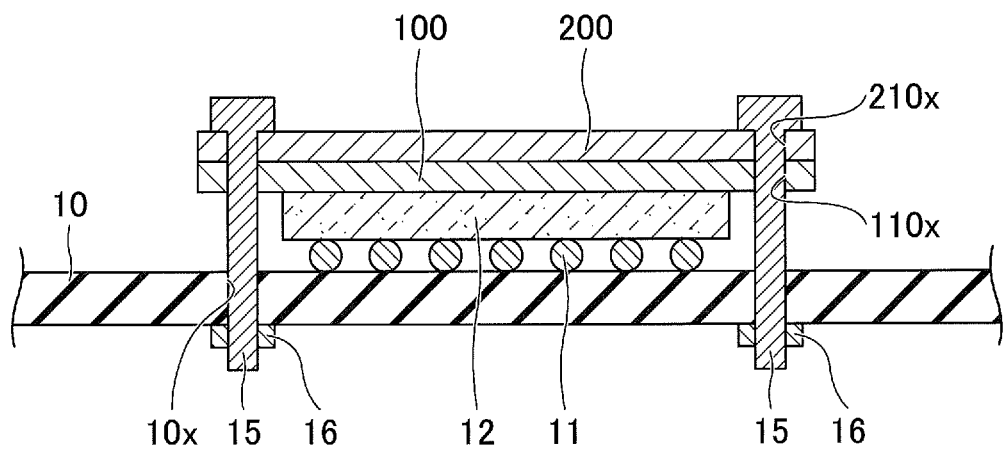
FIG. 4 is a cross sectional view of evaporators and peripheries of the evaporators in the cooler according to the first embodiment.

FIG. 4 is a cross sectional view of the evaporators 110 and 210 and peripheries of the evaporators 110 and 210 in the cooler 1 according to the first embodiment. As illustrated in FIG. 1 through FIG. 4, four through-holes 110x are formed in the evaporator 110, for example, and four through-holes 210x are formed in the evaporator 210, for example. The evaporator 110, the evaporator 210, and a circuit board 10 may be fixed to each other, by inserting each bolt 15 through each through-hole 210x formed in the evaporator 210, each through-hole 110x formed in the evaporator 110, and each through-hole 10x formed in the circuit board 10, and securing each bolt 15 by a nut 16 from a lower surface of the circuit board 10.

For example, a heat-generating component 12, such as a CPU or the like, is mounted on the circuit board 10 via bumps 11, and an upper surface of the heat-generating component 12 makes direct contact with a lower surface of the evaporator 110. In addition, the upper surface of the evaporator 110 adheres to the lower surface of the evaporator 210.

Figure 6A:
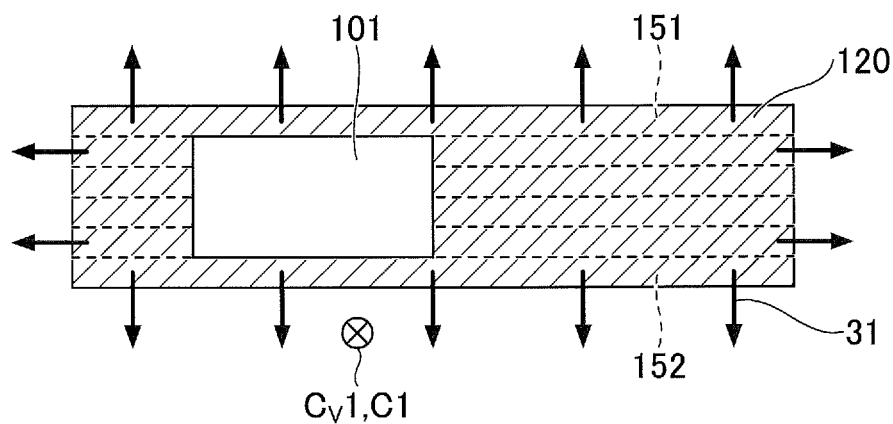
FIG. 6A and FIG. 6B are cross sectional views illustrating the cooler according to the first embodiment.
Figure 6B:
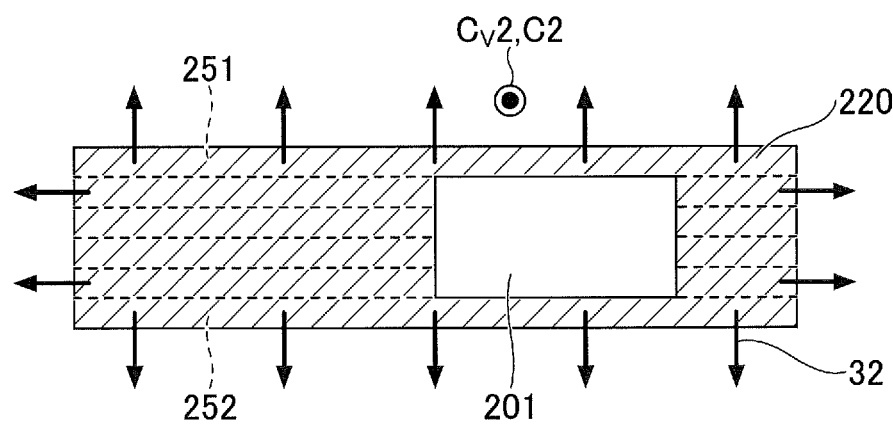

Heat transfer in the cooler 1 will be described. FIG. 5 and FIG. 6 are cross sectional views illustrating the cooler according to the first embodiment. FIG. 5 corresponds to a cross sectional view along a line I-I in FIG. 1. FIG. 6A corresponds to a cross sectional view along a line II-II in FIG. 1. FIG. 6B corresponds to a cross sectional view along a line in FIG. 1.

As illustrated in FIG. 5, the evaporator 110 is provided with a space 160 in which the working fluid C1 in the liquid phase permeates into the porous body 150, and the vapor Cv1 in the vapor phase flows to the vapor pipe 130. Similarly, the evaporator 210 is provided with a space 260 in which the working fluid C2 in the liquid phase permeates into the porous body 250, and the vapor Cv2 in the vapor phase flows to the vapor pipe 230.

As illustrated in FIG. 5, the heat generated from the heat-generating component 12 is first transferred to the evaporator 110, as indicated by a bold arrow 17. When the heat is transferred to the evaporator 110, the working fluid C1 permeated into the porous body 150 inside the evaporator 110 vaporizes, to generate the vapor Cv1.

A part of the heat transferred to the evaporator 110 is used to generate the vapor Cv1, and another part of the heat is transferred to the evaporator 210, as indicated by the bold arrow 17. When the heat is transferred to the evaporator 210, the working fluid C2 permeated into the porous body 250 inside the evaporator 210 vaporizes, to generate the vapor Cv2.

As illustrated in FIG. 1 and FIG. 3A, the vapor Cv1 generated by the evaporator 110 is guided to the condenser 120 via the vapor pipe 130, and is liquefied by the condenser 120. When the vapor Cv1 is liquefied, the heat transferred by the vapor Cv1 is released to a periphery of the condenser 120, as indicated by arrows 31 in FIG. 6A. Then, the working fluid C1 that is liquefied by the condenser 120 is guided to the evaporator 110 via the liquid pipe 140.

As illustrated in FIG. 1 and FIG. 3B, the vapor Cv2 generated by the evaporator 210 is guided to the condenser 220 via the vapor pipe 230, and is liquefied by the condenser 220. When the vapor Cv2 is liquefied, the heat transferred by the vapor Cv2 is released to a periphery of the condenser 220, as indicated by arrows 32 in FIG. 6B. Then, the working fluid C2 that is liquefied by the condenser 220 is guided to the evaporator 210 via the liquid pipe 240.

In the cooler 1, the heat generated from the heat-generating component 12 is not only transferred to the condenser 120, but is also transferred to the condenser 220. Accordingly, a good heat transfer performance can be obtained. Further, because the heat generated from the heat-generating component 12 is distributed to the loop heat pipes 100 and 200, a temperature rise of the loop heat pipe 100 is small compared to a case where the loop heat pipe 200 is not provided and the heat is received solely by the loop heat pipe 100, for example. When the temperature of the loop heat pipe 100 becomes excessively high, an internal pressure of the loop-shaped passage 101 may become too high and cause deformation of the loop heat pipe 100, however, such a deformation can be reduced or prevented according to the cooler 1.

In addition, in the cooler 1, when viewed from the mutually overlapping evaporators 110 and 210, the condensers 120 and 220 are positioned in mutually opposite directions. Accordingly, the heat transferred to the condenser 120 and the heat transferred to the condenser 220 uneasily interfere with each other. For this reason, the heat can be dissipated from the condensers 120 and 220 with a high efficiency.

Substances used for the working fluids C1 and C2 are not particularly limited, but in order to efficiently cool the heat-generating component 12 by the latent heat of vaporization, it is preferable to use fluids having a high saturated vapor pressure and a large latent heat of vaporization. Examples of such fluids include ammonia, water, fluorocarbon, alcohol, acetone, and mixtures of such fluids, for example.

Figure 7:
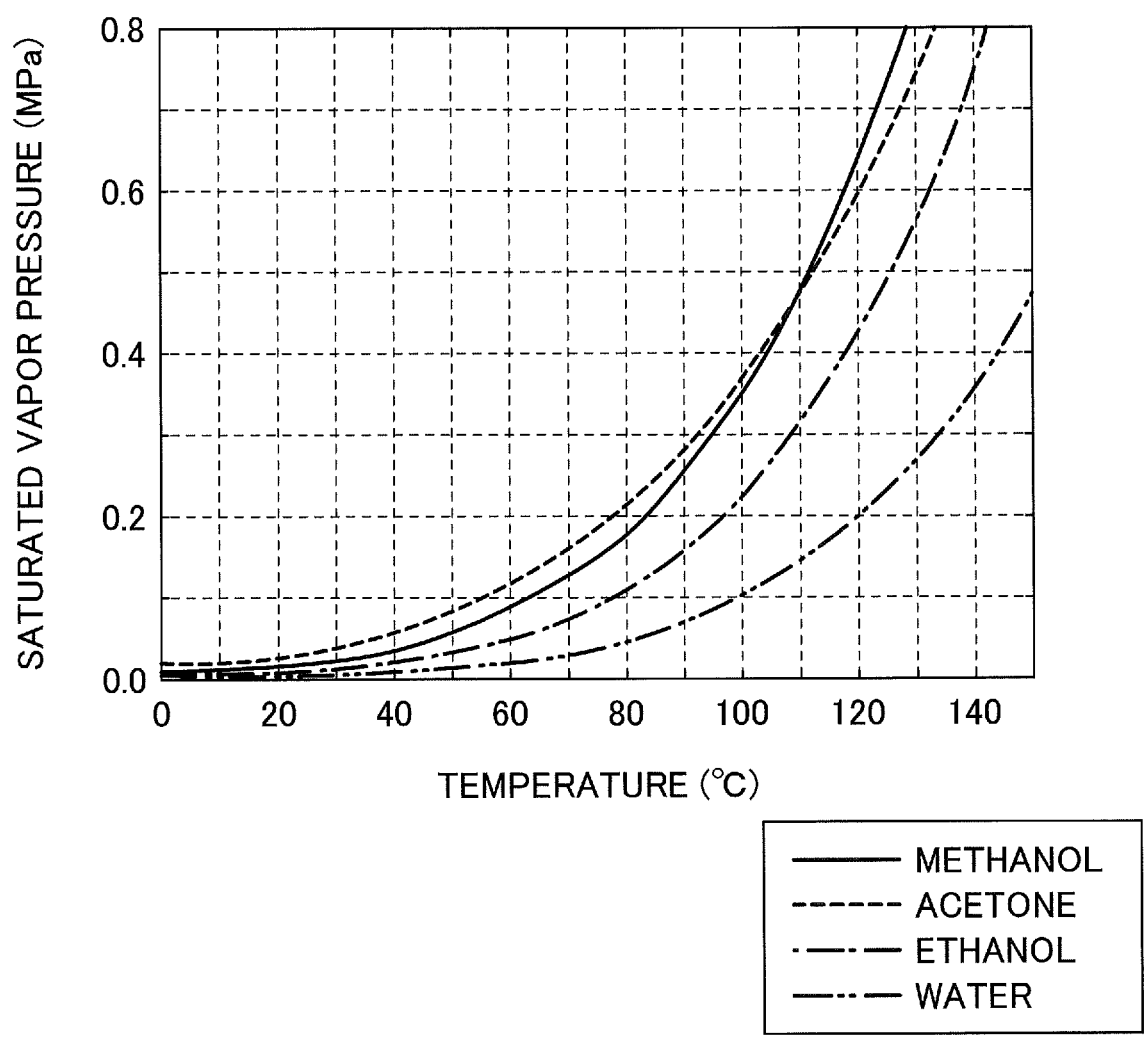
FIG. 7 is a diagram illustrating saturated vapor pressure curves of various substances.

FIG. 7 is a diagram illustrating saturated vapor pressure curves of various substances. The latent heat of vaporization of water is 2257 kJ/kg, the latent heat of vaporization of ethanol is 918.1 kJ/kg, the latent heat of vaporization of methanol is 1190 kJ/kg, and the latent heat of vaporization of acetone is 551.9 kJ/kg. In FIG. 7, a solid line indicates the saturated vapor pressure curve of methanol, a dotted line indicates the saturated vapor pressure curve of acetone, a one-dot chain line indicates the saturated vapor pressure curve of ethanol, and a two-dot chain line indicates the saturated vapor pressure curve of water.

When the same substance, such as water, for example, is used for the working fluids C1 and C2, and pressures inside the loop-shaped passage 101 of the loop heat pipe 100 and the loop-shaped passage 201 of the loop heat pipe 200 are made to differ, the operating temperature range can be made different between the evaporator 110 and the evaporator 210.

For example, water may be encapsulated in the loop-shaped passage 101 at an internal pressure of 40 hPa, and water may be encapsulated in the loop-shaped passage 201 at an internal pressure of 200 hPa. The boiling point of water under the pressure of 40 hPa is approximately 30° C., and the boiling point of water under the pressure of 200 hPa is approximately 60° C. Hence, in this case, the evaporator 110 operates from approximately 30° C., and the evaporator 210 operates from approximately 60° C. Accordingly, the cooler 1 starts to operate from approximately 30° C. In addition, when an environmental temperature becomes a higher temperature of 60° C., for example, the flow of the working fluid C1 in the loop-shaped passage 101 decreases, however, the evaporator 210 starts to operate. For this reason, the cooler 1 can continue to operate. In other words, according to the above-mentioned combination, it is possible to widen the operating temperature range.

On the other hand, water may be encapsulated in the loop-shaped passage 101 at an internal pressure of 200 hPa, and water may be encapsulated in the loop-shaped passage 201 at an internal pressure of 40 hPa. In this case, the evaporator 110 operates from approximately 60° C., and the evaporator 210 operates from approximately 30° C. Because the temperature of the evaporator 110 which is closer to the heat-generating component 12 becomes higher than that of the evaporator 210, this combination can reduce a difference between operation start timings of the loop heat pipes 100 and 200. Particularly if the timing when the temperature of the evaporator 110 becomes approximately 60° C. and the timing when the temperature of the evaporator 210 becomes approximately 30° C. are approximately the same, the loop heat pipes 100 and 200 start operating approximately at the same time. By reducing the difference between the operation start timings, it is possible to reduce an excessive rise in the internal pressure of the loop heat pipe which starts to operate first.

Different substances may be used for the working fluids C1 and C2.

For example, water may be encapsulated in the loop-shaped passage 201 at an internal pressure of 200 hPa, and a mixture of water and ethanol may be encapsulated in the loop-shaped passage 101 at an internal pressure of 200 hPa. The boiling point of the mixture of water and ethanol is lower than the boiling point of water. Accordingly, it is also possible in this case to widen the operating temperature range, while improving the heat transfer performance. In addition, the latent heat of vaporization of water is larger than the latent heat of vaporization of ethanol, and the saturated vapor pressure of ethanol is higher than the saturated vapor pressure of water in a main working temperature range of 50° C. to 100° C., for example. Accordingly, a good heat transfer performance can be obtained, while enabling a quick start of the operation of the cooler 1.

On the other hand, a mixture of water and ethanol may be encapsulated in the loop-shaped passage 201 at an internal pressure of 200 hPa, and water may be encapsulated in the loop-shaped passage 101 at an internal pressure of 200 hPa. This combination can reduce the difference between operation start timings of the loop heat pipes 100 and 200, and reduce an excessive rise in the internal pressure of the loop heat pipe which starts to operate first.

In addition, the internal pressure may differ between the loop-shaped passages 101 and 201, and different substances may be used for the working fluids C1 and C2.

A metal layer forming the evaporator 110 may be directly bonded to a metal layer forming the evaporator 210. In other words, the uppermost layer among the plurality of metal layers forming the evaporator 110, and the lowermost layer among the plurality of metal layers forming the evaporator 210, are directly bonded to each other.

Figure 8:
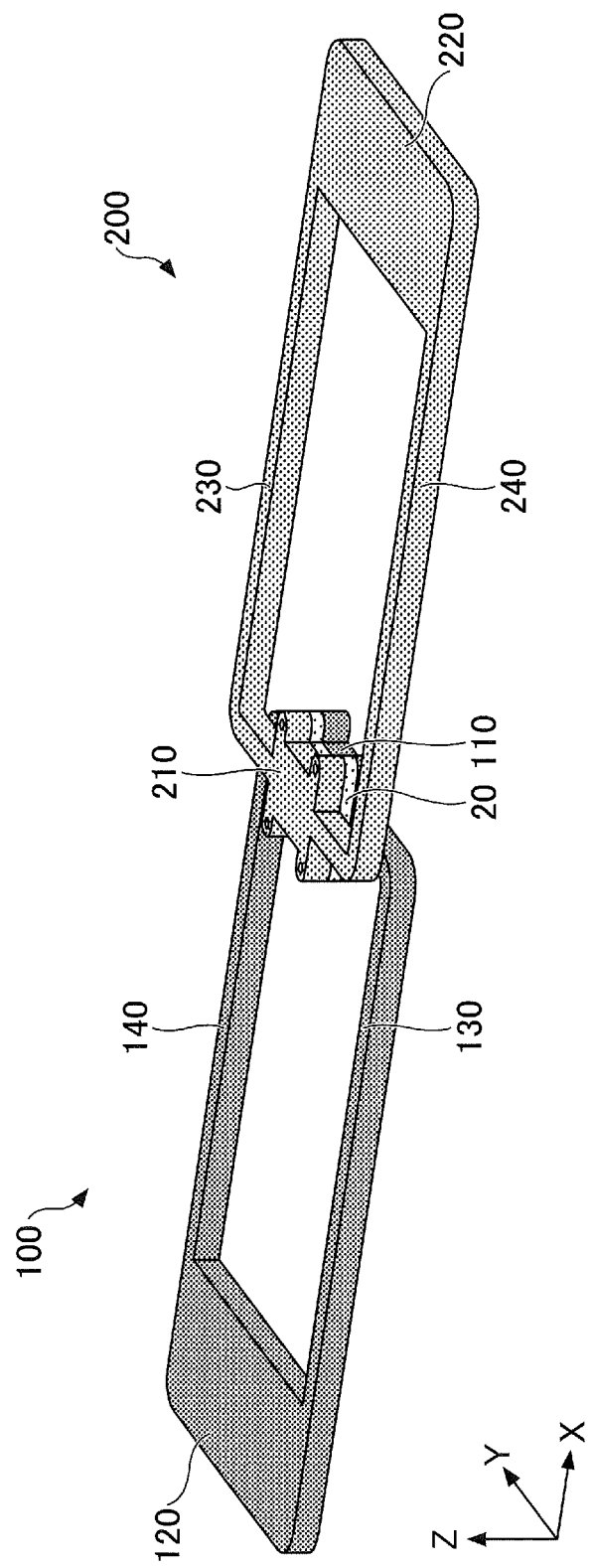
FIG. 8 is a perspective view schematically illustrating the cooler according to a modification of the first embodiment.
Figure 9:
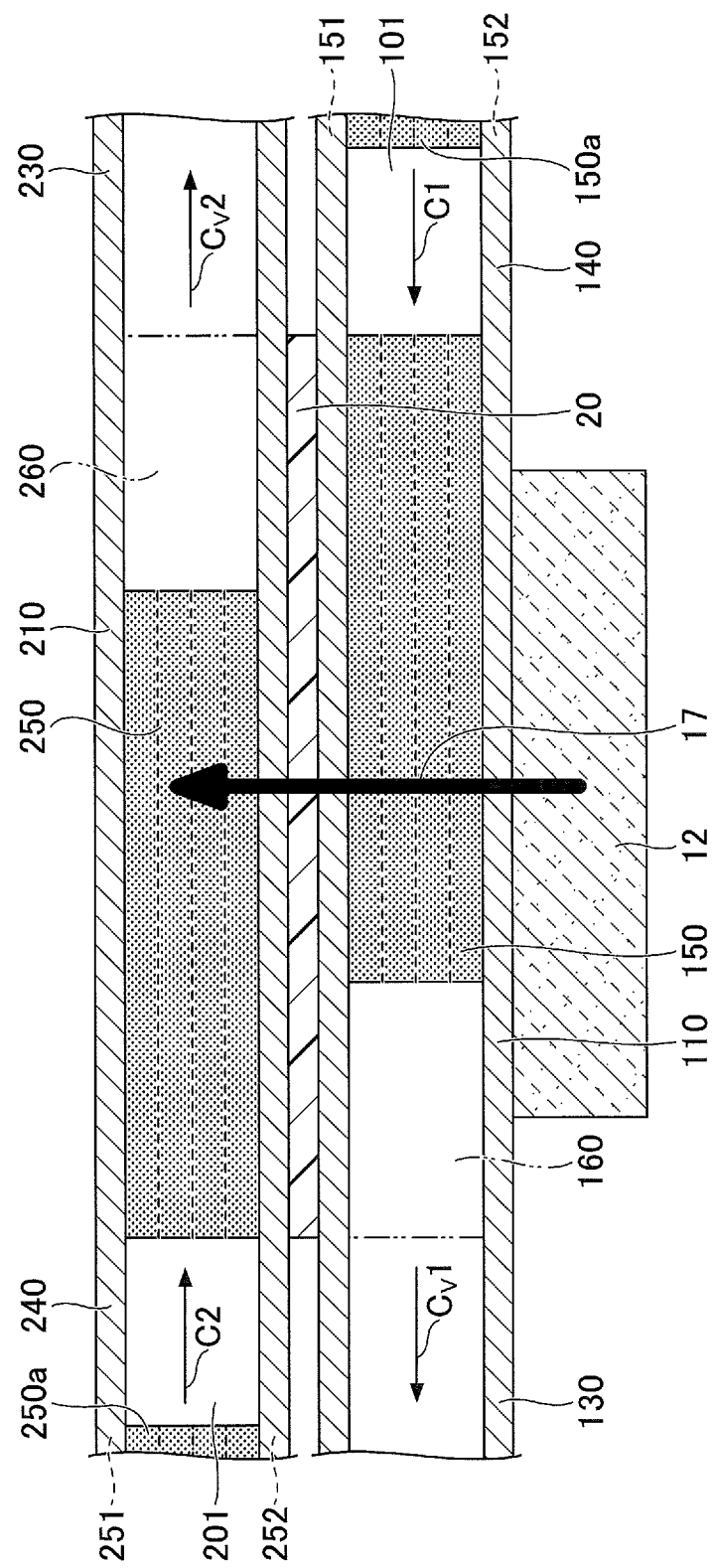
FIG. 9 is a cross sectional view illustrating the cooler according to the modification of the first embodiment.

Moreover, as illustrated in FIG. 8 and FIG. 9, the evaporators 110 and 210 may overlap each other via a Thermal Interface Material (TIM) 20, such as a highly thermal conductive resin or the like. FIG. 8 is a perspective view schematically illustrating the cooler according to a modification of the first embodiment. FIG. 9 is a cross sectional view illustrating the cooler according to the modification of the first embodiment.

As illustrated in FIG. 9, the heat generated from the heat-generating component 12 is also first transferred to the evaporator 110, as indicated by the bold arrow 17, when the TIM 20 is interposed between the evaporators 110 and 210. When the heat is transferred to the evaporator 110, the working fluid C1 permeated into the porous body 150 inside the evaporator 110 is vaporized, to generate the vapor Cv1. A part of the heat transferred to the evaporator 110 is used to generate the vapor Cv1, and another part of the heat is transferred to the evaporator 210 as indicated by the bold arrow 17. When the heat is transferred to the evaporator 210, the working fluid C2 permeated into the porous body 250 inside the evaporator 210 is vaporized, to generate the vapor Cv2.

Moreover, the evaporators 110 and 210 may overlap each other via a solder. Examples of the solder that may be used include an alloy that includes Pb, an alloy of Sn and Cu, an alloy of Sn and Sb, an alloy of Sn and Ag, and alloy of Sn, Ag, and Cu, or the like, for example.

Second Embodiment

Figure 10:
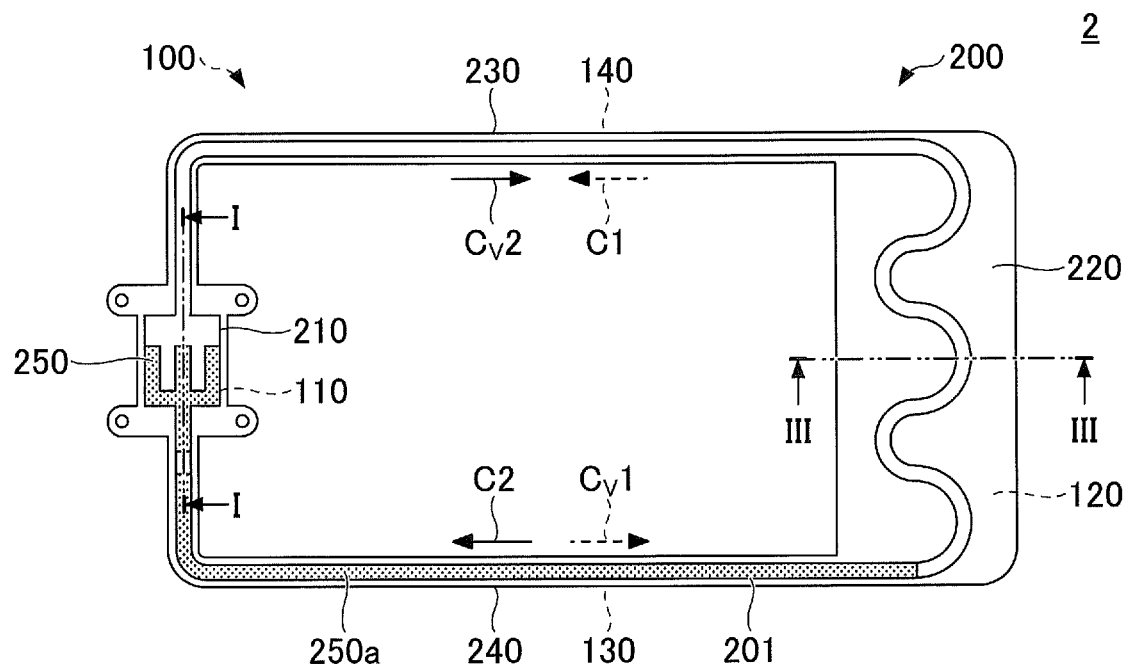
FIG. 10 is a plan view schematically illustrating the cooler according to a second embodiment.
Figure 11:
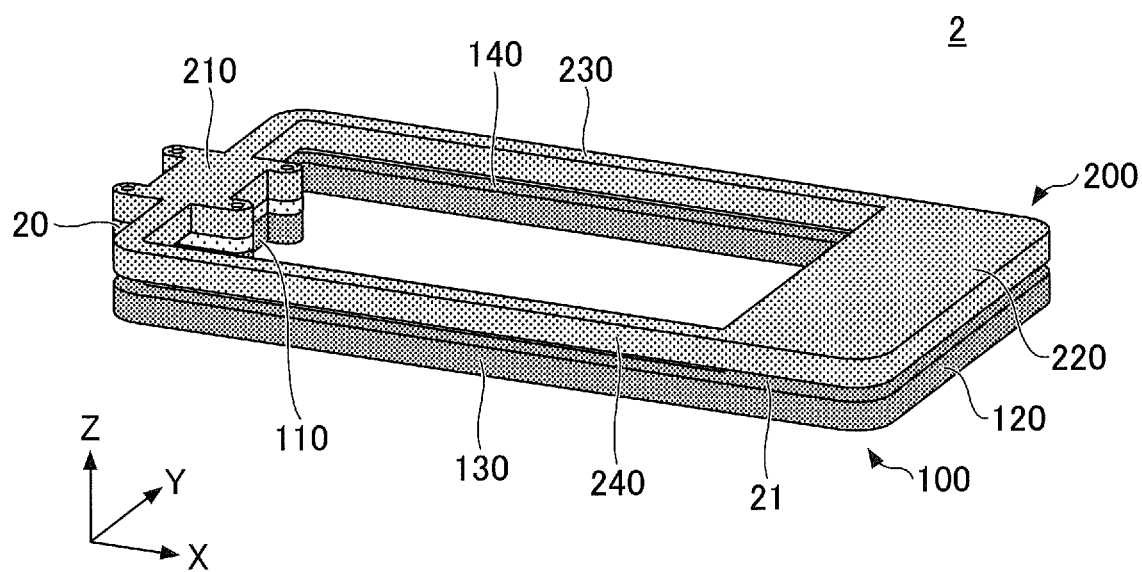
FIG. 11 is a perspective view schematically illustrating the cooler according to the second embodiment.

Next, a second embodiment will be described. A cooler according to the second embodiment includes two loop heat pipes. FIG. 10 is a plan view schematically illustrating the cooler according to the second embodiment. FIG. 11 is a perspective view schematically illustrating the cooler according to the second embodiment. In FIG. 10, however, the illustration of the metal layer (the metal layer 251 illustrated in FIG. 12) forming one of the outermost layers is omitted.

As illustrated in FIG. 10 and FIG. 11, a cooler 2 according to the second embodiment includes the loop heat pipe 100 and the loop heat pipe 200. The cooler 2 may be accommodated in a mobile electronic apparatus, such as a smartphone, a tablet terminal, or the like, for example.

As illustrated in FIG. 10 and FIG. 11, in the cooler 2, the evaporators 110 and 210 overlap each other via the TIM 20. The thickness of the TIM 20 is not particularly limited, but may be in a range of approximately 0.1 mm to approximately 0.5 mm, for example. Unlike the first embodiment, the condensers 120 and 220 also overlap each other in the plan view. In other words, when viewed from the mutually overlapping evaporators 110 and 210, the condensers 120 and 220 are positioned in identical directions. However, because the TIM 20 is interposed between the evaporators 110 and 210, a space 21 exists between the condenser 120 and the condenser 220.

In addition, the vapor pipe 130 and the liquid pipe 240 overlap each other, and the liquid pipe 140 and the vapor pipe 230 overlap each other. Further, the space 21 also exists between the vapor pipe 130 and the liquid pipe 240. The space 21 also exists between the liquid pipe 140 and the vapor pipe 230.

Forms of the overlap between the loop heat pipe 100 and the loop heat pipe 200 are not limited to the above mentioned forms, and for example, the evaporator 130 and the evaporator 230 may overlap each other, and the liquid pipe 140 and the liquid pipe 240 may overlap each other.

The structure of other parts of the cooler 2 are similar to the corresponding structure of the cooler 1 according to the first embodiment.

In the cooler 2 according to the second embodiment, the evaporator 110, the evaporator 210, and the circuit board 10 may be fixed to each other, similar to the cooler 1 illustrated in FIG. 4.

Figure 12:
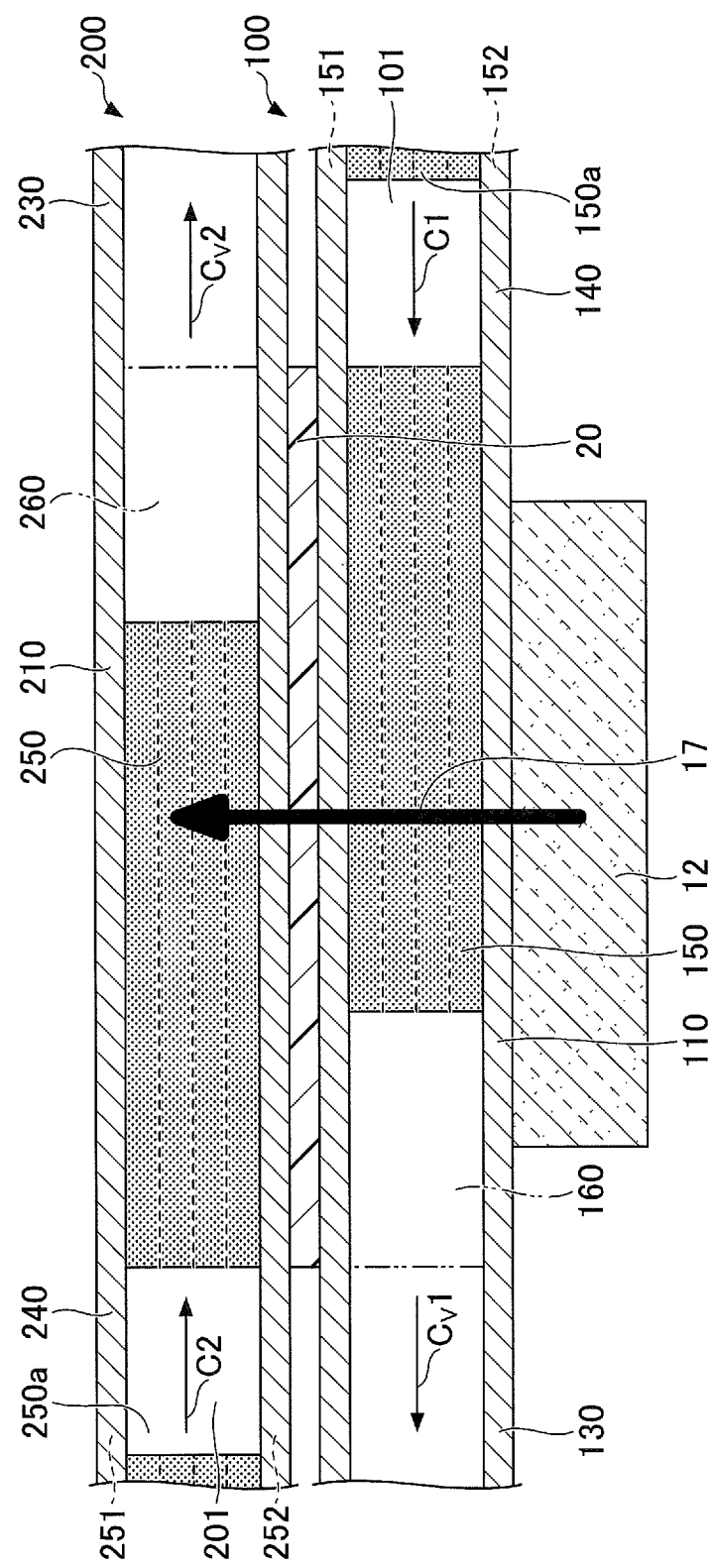
FIG. 12 is a cross sectional view illustrating the cooler according to the second embodiment.
Figure 13:
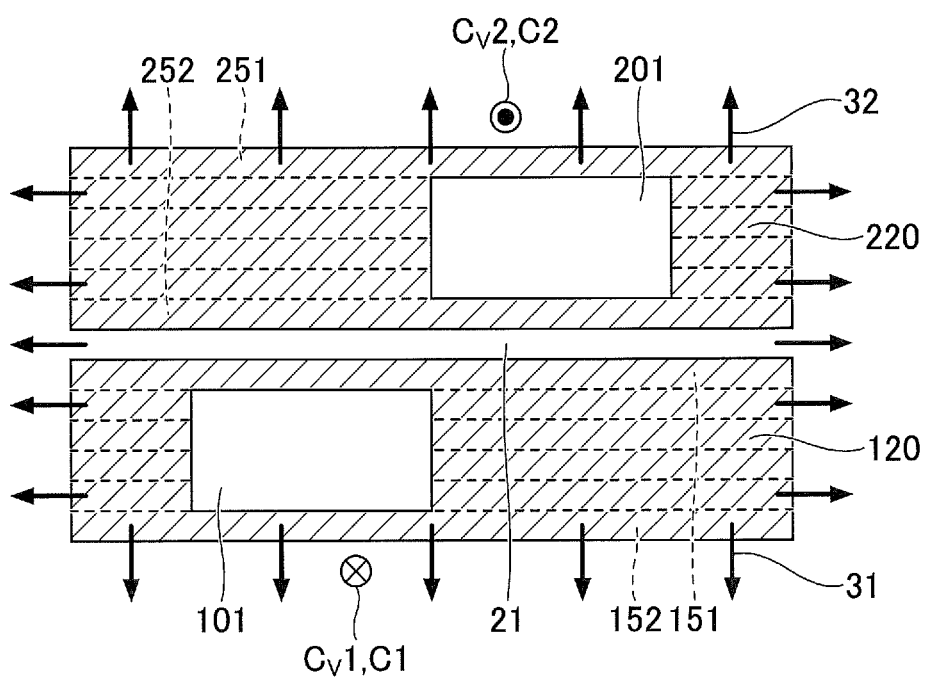
FIG. 13 is a cross sectional view illustrating the cooler according to the second embodiment.

Next, the heat transfer in the cooler 2 will be described. FIG. 12 and FIG. 13 are cross sectional views illustrating the cooler according to the second embodiment. FIG. 12 corresponds to a cross sectional view along a line I-I in FIG. 10. FIG. 13 corresponds to a cross sectional view along a line in FIG. 10.

As illustrated in FIG. 12, the heat generated from the heat-generating component 12 is first transferred to the evaporator 110, as indicated by the bold arrow 17. When the heat is transferred to the evaporator 110, the working fluid C1 permeated into the porous body 150 inside the evaporator 110 vaporizes, to generate the vapor Cv1.

A part of the heat transferred to the evaporator 110 is used to generate the vapor Cv1, and another part of the heat is transferred to the evaporator 210, as indicated by the bold arrow 17. When the heat is transferred to the evaporator 210, the working fluid C2 permeated into the porous body 250 inside the evaporator 210 vaporizes, to generate the vapor Cv2.

As illustrated in FIG. 10 and FIG. 3A, the vapor Cv1 generated by the evaporator 110 is guided to the condenser 120 via the vapor pipe 130, and is liquefied by the condenser 120. When the vapor Cv1 is liquefied, the heat transferred by the vapor Cv1 is released to the periphery of the condenser 120, as indicated by the arrows 31 in FIG. 13. Then, the working fluid C1 that is liquefied by the condenser 120 is guided to the evaporator 110 via the liquid pipe 140.

As illustrated in FIG. 10 and FIG. 3B, the vapor Cv2 generated by the evaporator 210 is guided to the condenser 220 via the vapor pipe 230, and is liquefied by the condenser 220. When the vapor Cv2 is liquefied, the heat transferred by the vapor Cv2 is released to the periphery of the condenser 220, as indicated by the arrows 32 in FIG. 13. Then, the working fluid C2 that is liquefied by the condenser 220 is guided to the evaporator 210 via the liquid pipe 240.

In the cooler 2, the heat generated from the heat-generating component 12 is not only transferred to the condenser 120, but is also transferred to the condenser 220. Accordingly, a good heat transfer performance can be obtained. Further, because the heat generated from the heat-generating component 12 is distributed to the loop heat pipes 100 and 200, the deformation of the loop heat pipe 100, for example, caused by the rise of the internal pressure, can be reduced or prevented according to the cooler 2, similar to the cooler 1.

In addition, in the cooler 2, the condensers 120 and 220 overlap each other, with the space 21 interposed therebetween. Accordingly, the heat is also dissipated from the space 21. For this reason, the heat can be dissipated from the condensers 120 and 220 with a high efficiency.

Further, compared to the cooler 1, the cooler 2 is suitable for space-saving. Hence, the cooler 2 can be used even in a case where a setup space inside the electronic device or the like is small and limited.

Figure 14:
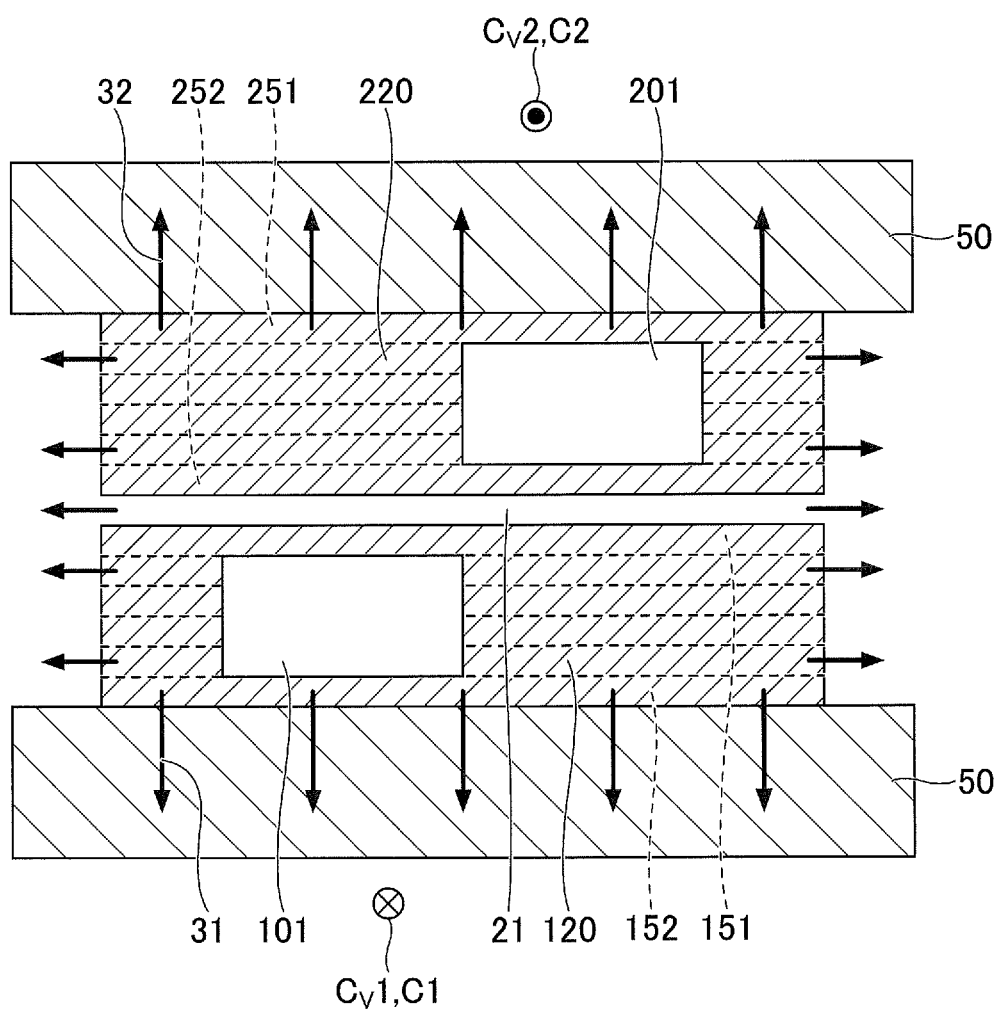
FIG. 14 is a cross sectional view illustrating the cooler according to a first modification of the second embodiment.

As illustrated in FIG. 14, the lower surface of the condenser 120 and the upper surface of the condenser 220 may contact a casing 50 which has a thermal conductivity higher than the thermal conductivity of air. FIG. 14 is a cross sectional view illustrating the cooler according to a first modification of the second embodiment. For example, an aluminum casing may be used as the casing 50. The heat dissipation efficiency can be improved, because the lower surface of the condenser 120 and the upper surface of the condenser 220 make contact with the casing 50 having a thermal conductivity higher than that of air. The casing 50 is an example of a heat dissipating member. The heat dissipating member may use a heat sink or the like.

Figure 15:
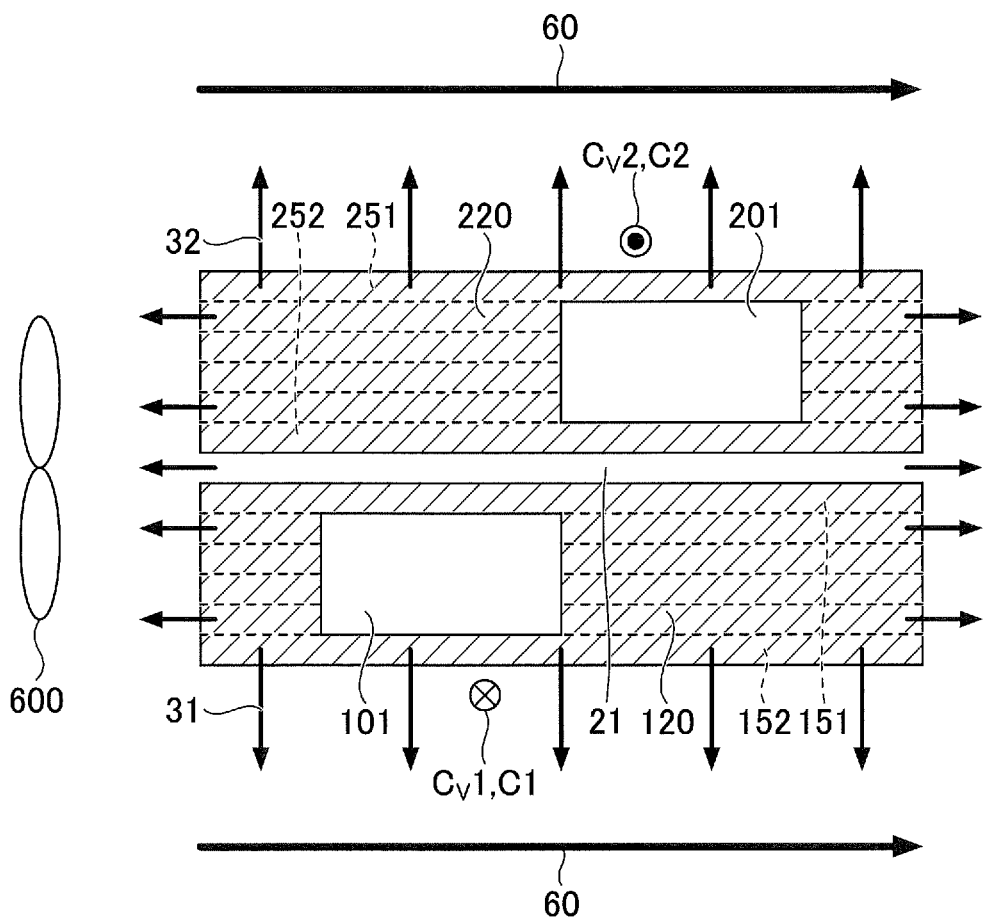
FIG. 15 is a cross sectional view illustrating the cooler according to a second modification of the second embodiment.

In addition, as illustrated in FIG. 15, an air flow 60 may be generated in a periphery the condensers 120 and 220 using a fan 600 or the like. FIG. 15 is a cross sectional view illustrating the cooler according to a second modification of the second embodiment, and illustrates the fan 600 schematically for the sake of convenience. By generating the air flow 60, it is possible to improve the heat dissipation efficiency, by reducing or preventing stagnation of the heat dissipated from the condensers 120 and 220 in the peripheries of the condensers 120 and 220.

The casing 50 may be provided, and the air flow 60 may be generated, in the cooler 1 according to the first embodiment. By providing the casing 50, and generating the air flow 60, it is possible to further improve the heat dissipation efficiency.

Figure 16:
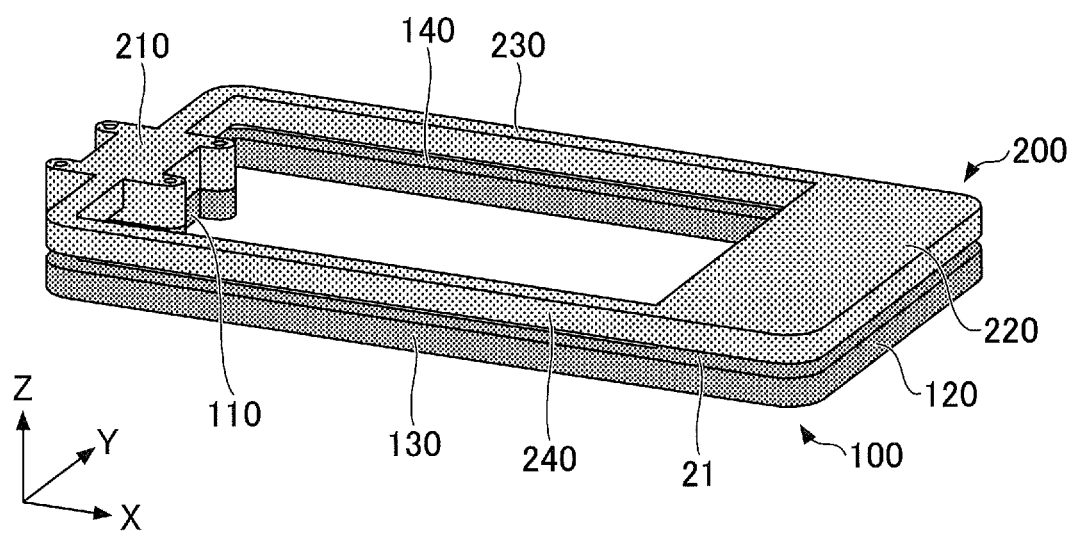
FIG. 16 is a perspective view schematically illustrating the cooler according to a third modification of the second embodiment.

It is not essential to provide the TIM 20 of the second embodiment. For example, as illustrated in FIG. 16, the loop heat pipe 200 may be configured so that the lower surface of the evaporator 210 is lower than the lower surface of the condenser 220. In this case, the space 21 can be formed between the condenser 120 and the condenser 220, without using the TIM 20. In other words, the thickness of the evaporator 210 of the loop heat pipe 200 is set larger than the thickness of the condenser 220. FIG. 16 is a perspective view schematically illustrating the cooler according to a third modification of the second embodiment.

Third Embodiment

Figure 17:
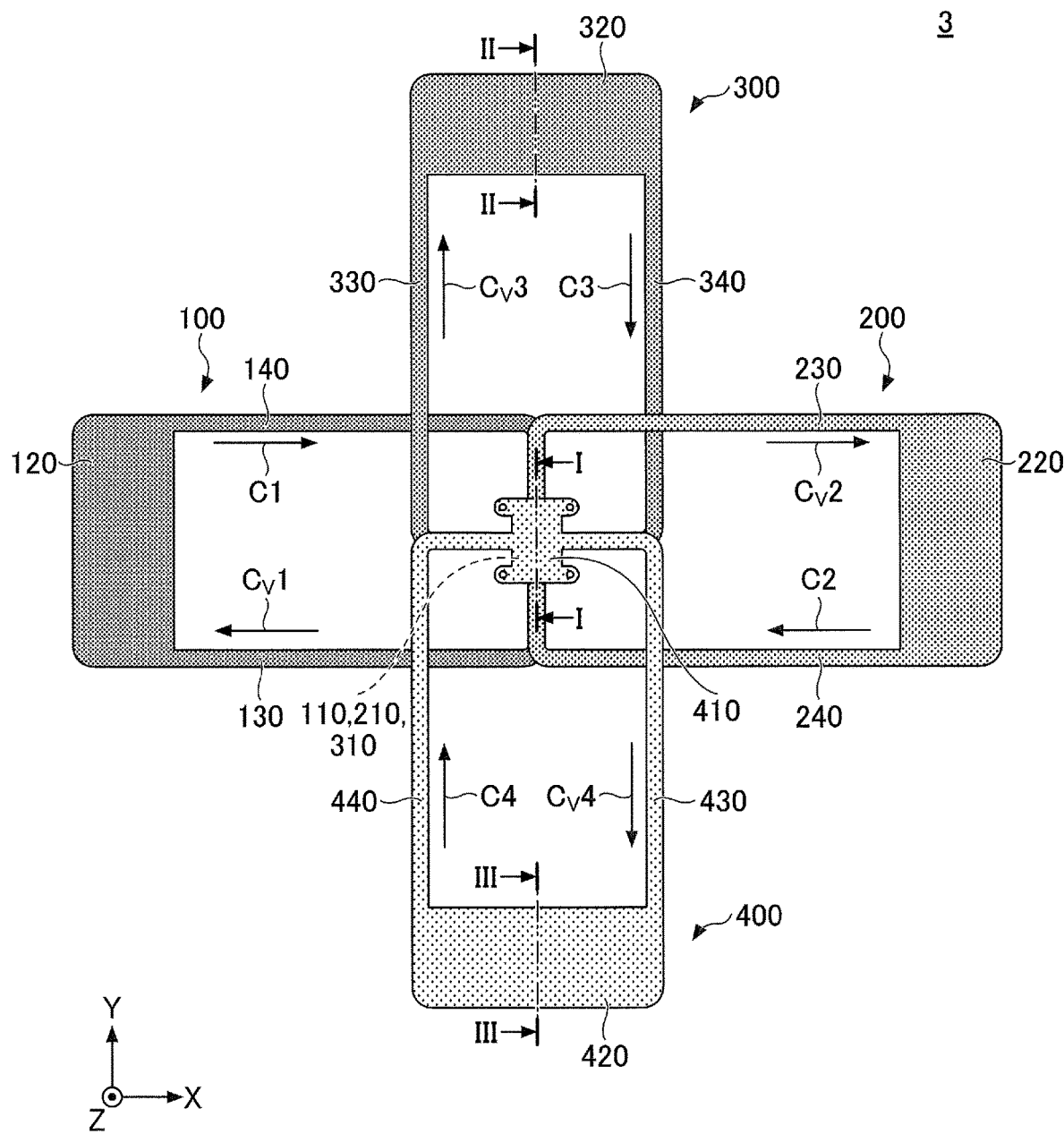
FIG. 17 is a plan view schematically illustrating the cooler according to a third embodiment.
Figure 18:
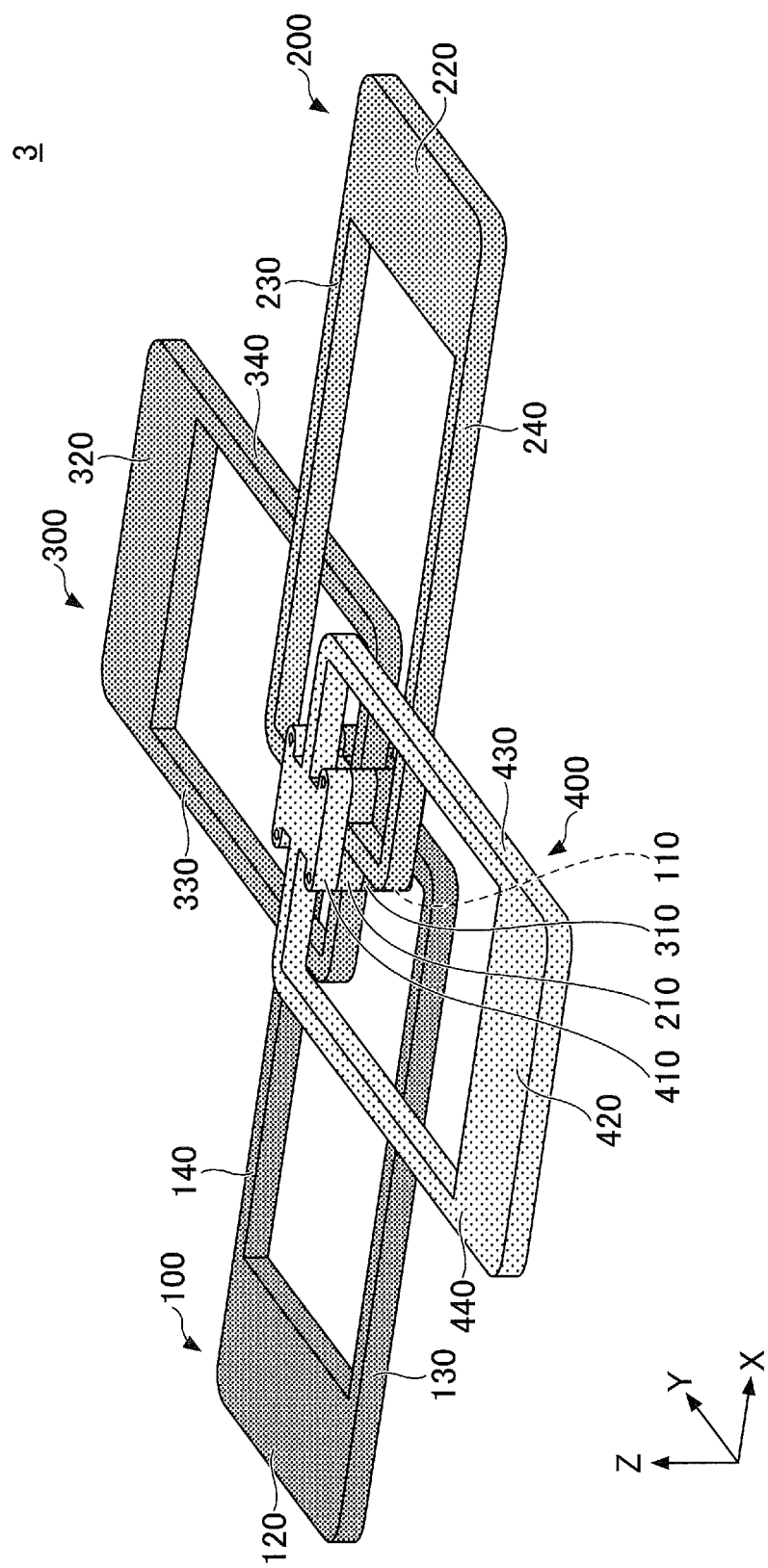
FIG. 18 is a perspective view schematically illustrating the cooler according to the third embodiment.
Figure 19A:
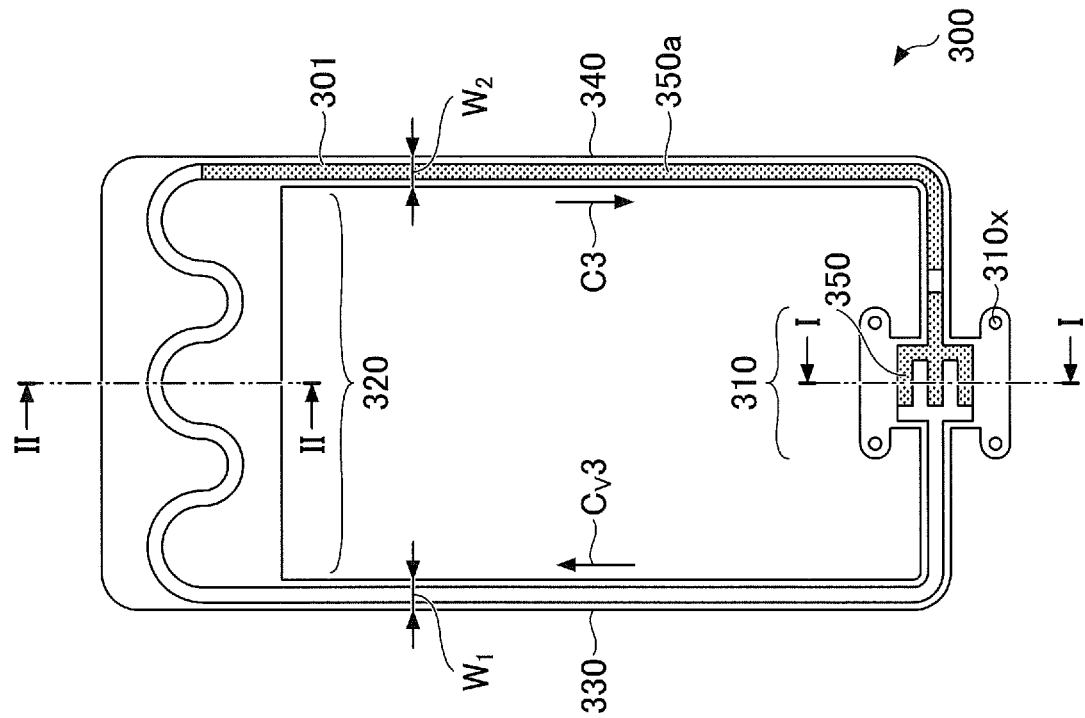
FIG. 19A and FIG. 19B are plan views schematically illustrating the loop heat pipes included in the cooler according to the third embodiment.
Figure 19B:
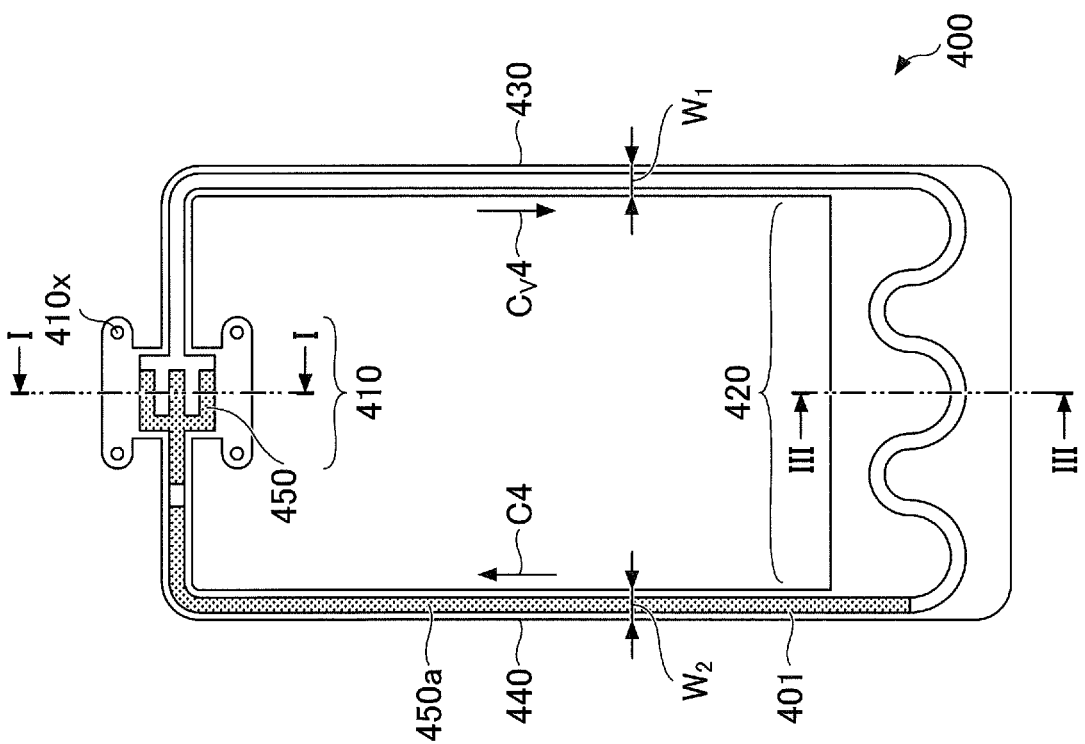

Next, a third embodiment will be described. A cooler according to the third embodiment includes four loop heat pipes. FIG. 17 is a plan view schematically illustrating the cooler according to a third embodiment. FIG. 18 is a perspective view schematically illustrating the cooler according to the third embodiment. FIG. 19A and FIG. 19B are plan views schematically illustrating the loop heat pipes included in the cooler according to the third embodiment. In FIG. 19A and FIG. 19B, however, the illustration of metal layers (metal layers 351 and 451 illustrated in FIG. 21) forming one of outermost layers is omitted.

As illustrated in FIG. 17 and FIG. 18, a cooler 3 according to the third embodiment includes the loop heat pipe 100, the loop heat pipe 200, a loop heat pipe 300, and a loop heat pipe 400. The cooler 3 may be accommodated in a mobile electronic apparatus, such as a smartphone, a tablet terminal, or the like, for example.

Figure 21:
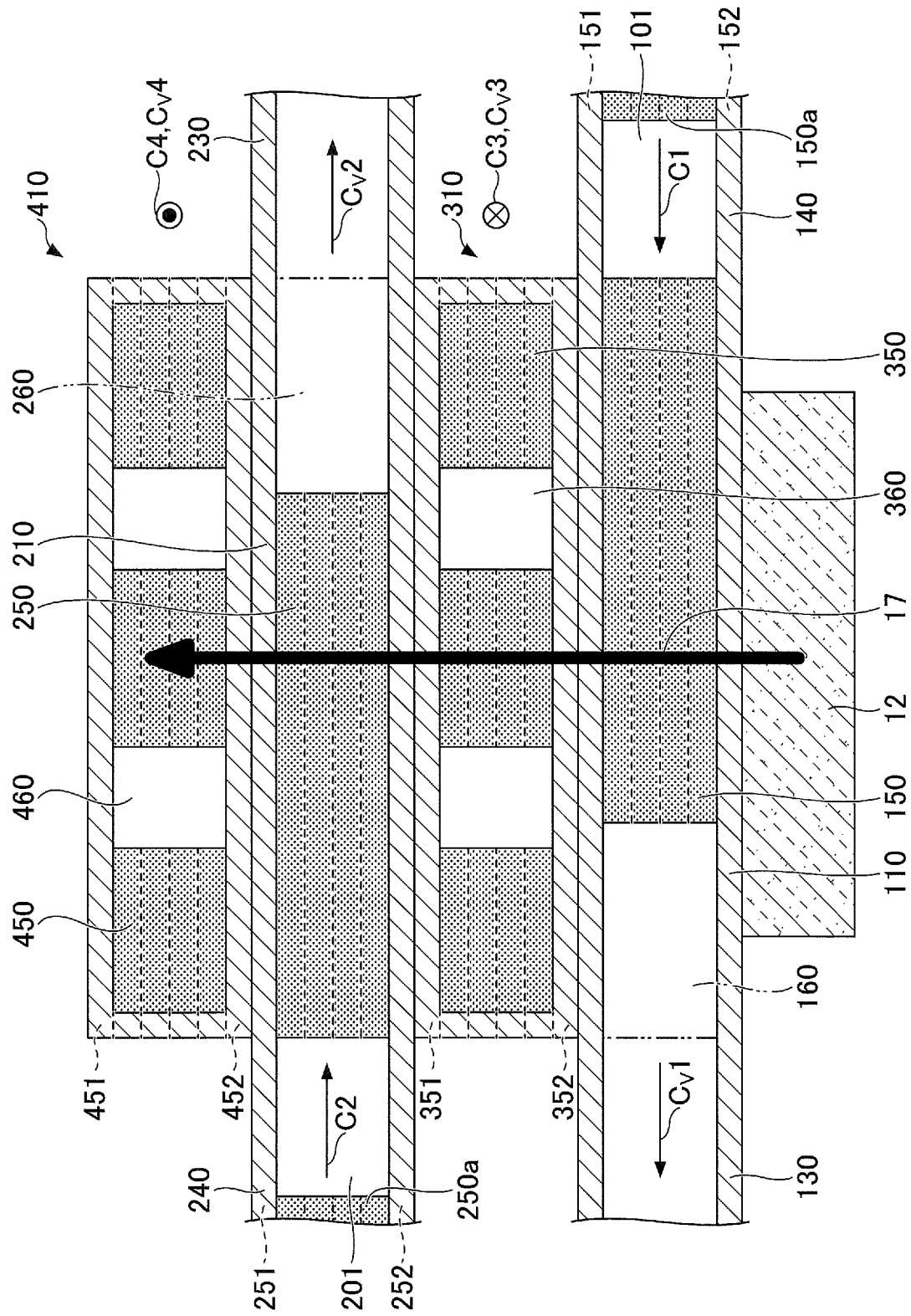
FIG. 21 is a cross sectional view illustrating the cooler according to the third embodiment.

As illustrated in FIG. 19A, the loop heat pipe 300 includes an evaporator 310, a condenser 320, a vapor pipe 330, and a liquid pipe 340. The evaporator 310, the condenser 320, the vapor pipe 330, and the liquid pipe 340 may be formed by a structure in which a plurality of metal layers are laminated as illustrated in FIG. 21, similar to the loop heat pipes 100 and 200, for example. The metal layers are copper layers having a high thermal conductivity, for example, and the metal layers are directly bonded to each other by solid-phase (or solid-state) bonding or the like. Each of the metal layers may have a thickness of approximately 50 μm to approximately 200 μm, for example.

Of course, the metal layers of the loop heat pipe 300 are not limited to the copper layers, and may be stainless steel layers, aluminum layers, magnesium alloy layers, or the like, for example. In addition, the number of metal layers that are laminated is not limited to a particular number.

As illustrated in FIG. 19A, a porous body 350 having a comb shape in the plan view, for example, is provided inside the evaporator 310. For example, the porous body 350 is integrally formed to make contact with a pipe wall. In addition, a porous body 350a is also provided inside the liquid pipe 340. The porous body 350 and the porous body 350a include a plurality of pores (not illustrated) formed in the metal layers between the two metal layers 351 and 352 forming the outermost layers of the above mentioned plurality of metal layers, for example.

In the loop heat pipe 300, the evaporator 310 has a function to vaporize a working fluid C3 to generate vapor Cv3. The condenser 320 has a function to liquefy the vapor Cv3 of the working fluid C3. The evaporator 310 and the condenser 320 are connected via the vapor pipe 330 and the liquid pipe 340, and the vapor pipe 330 and the liquid pipe 340 form a loop-shaped passage 301 in which the working fluid C3 or the vapor Cv3 flows.

An inlet (not illustrated) is provided in the liquid pipe 340, and the working fluid C3 is filled into the liquid pipe 340 through the inlet. After filling the working fluid C3 into the liquid pipe 340, the inlet is sealed by a sealing member (not illustrated), for example.

As illustrated in FIG. 19B, the loop heat pipe 400 includes an evaporator 410, a condenser 420, a vapor pipe 430, and a liquid pipe 440. The evaporator 410, the condenser 420, the vapor pipe 430, and the liquid pipe 440 may be formed by a structure in which a plurality of metal layers are laminated as illustrated in FIG. 21, for example. The metal layers are copper layers having a high thermal conductivity, for example, and the metal layers are directly bonded to each other by solid-phase (or solid-state) bonding or the like. Each of the metal layers may have a thickness of approximately 50 μm to approximately 200 μm, for example.

Of course, the metal layers of the loop heat pipe 400 are not limited to the copper layers, and may be stainless steel layers, aluminum layers, magnesium alloy layers, or the like, for example. In addition, the number of metal layers that are laminated is not limited to a particular number.

As illustrated in FIG. 19B, a porous body 450 having a comb shape in the plan view, for example, is provided inside the evaporator 410. For example, the porous body 450 is integrally formed to make contact with a pipe wall. In addition, a porous body 450a is also provided inside the liquid pipe 440. The porous body 450 and the porous body 450a include a plurality of pores (not illustrated) foiled in the metal layers between the two metal layers 451 and 452 forming the outermost layers of the above mentioned plurality of metal layers, for example.

In the loop heat pipe 400, the evaporator 410 has a function to vaporize a working fluid C4 to generate vapor Cv4. The condenser 420 has a function to liquefy the vapor Cv4 of the working fluid C4. The evaporator 410 and the condenser 420 are connected via the vapor pipe 430 and the liquid pipe 440, and the vapor pipe 430 and the liquid pipe 440 form a loop-shaped passage 401 in which the working fluid C4 or the vapor Cv4 flows.

An inlet (not illustrated) is provided in the liquid pipe 440, and the working fluid C4 is filled into the liquid pipe 440 through the inlet. After filling the working fluid C4 into the liquid pipe 440, the inlet is sealed by a sealing member (not illustrated), for example.

The vapor pipes 330 and 430 may have a width $W_1$ of approximately 8 mm, for example. In addition, the liquid pipes 340 and 440 may have a width $W_2$ of approximately 6 mm, for example. Of course, the width $W_1$ of the vapor pipes 330 and 430 and the width $W_2$ of the liquid pipes 340 and 440 are not limited to the above mentioned values, and the widths $W_1$ and $W_2$ may be the same.

As illustrated in FIG. 17 and FIG. 18, in the cooler 3, the upper surface of the evaporator 110 makes direct contact with a lower surface of the evaporator 310, an upper surface of the evaporator 310 makes direct contact with the lower surface of the evaporator 210, and the upper surface of the evaporator 210 makes direct contact with a lower surface of the evaporator 410. The evaporators 110, 210, 310, and 410 overlap each other in the plan view.

The positional relationship between the loop heat pipe 100 and the loop heat pipe 200 in the plan view is similar to that of the first embodiment. That is, the condensers 120 and 220 are arranged so that the evaporators 110, 210, 310, and 410 are positioned between the condensers 120 and 220, and the condenser 120 and the condenser 220 are positioned symmetrically in the X-direction when viewed from the evaporators 110, 210, 310, and 410 which are regarded as the center of the view.

In addition, the condensers 320 and 420 are arranged so that the evaporators 110, 210, 310, and 410 are positioned between the condensers 320 and 420. That is, the condenser 320 and the condenser 420 are positioned symmetrically in the Y-direction when viewed from the evaporators 110, 210, 310, and 410 which are regarded as the center of the view. More particularly, when viewed from the evaporators 110, 210, 310, and 410, the condenser 320 is positioned in the +Y-direction, and the condenser 420 is positioned in the −Y-direction.

Further, the evaporators 330 and 440 are positioned symmetrically in the Y-direction when viewed from the evaporators 110, 210, 310, and 410 which are regarded as the center of the view, and the liquid pipe 340 and the vapor pipe 430 are positioned symmetrically.

The positional relationship of each of the evaporators 310 and 410, the condensers 320 and 420, the vapor pipes 330 and 430, and the liquid pipes 340 and 440 is not limited to the above mentioned positional relationship, and may be appropriately set to other positional relationships. For example, the metal layers may be laminated so that, when viewed from the evaporators 110, 210, 310, and 410 which are regarded as the center of the view, the vapor pipe 330 and the vapor pipe 430 are arranged at symmetrical positions along the Y-direction, and the liquid pipe 340 and the liquid pipe 440 are arranged at symmetrical positions along the Y-direction.

Figure 20:
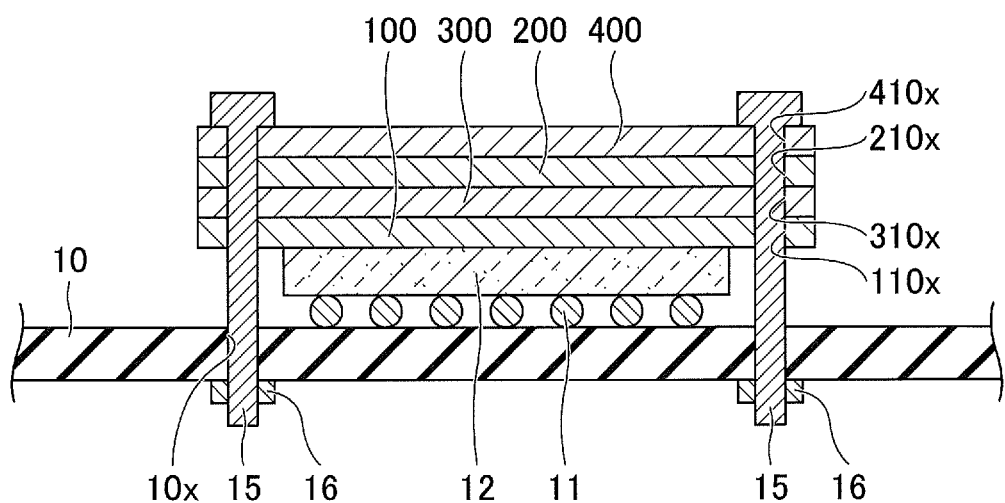
FIG. 20 is a cross sectional view illustrating the evaporators and the peripheries of the evaporators in the cooler according to the third embodiment.

FIG. 20 is a cross sectional view illustrating the evaporators 110, 210, 310, and 410 and the peripheries of the evaporators 110, 210, 310, and 410 in the cooler 3 according to the third embodiment. As illustrated in FIG. 17 through FIG. 20, four through-holes 310x are formed in the evaporator 310, for example, and four through-holes 410x are formed in the evaporator 410, for example. The evaporator 110, the evaporator 210, the evaporator 310, the evaporator 410, and the circuit board 10 may be fixed to each other, by inserting each bolt 15 through each through-hole 410x formed in the evaporator 410, each through-hole 210x formed in the evaporator 210, each through-hole 310x formed in the evaporator 310, each through-hole 110x formed in the evaporator 110, and each through-hole 10x formed in the circuit board 10, and securing each bolt 15 by the nut 16 from the lower surface of the circuit board 10.

For example, the heat-generating component 12, such as a CPU or the like, is mounted on the circuit board 10 via the bumps 11, and an upper surface of the heat-generating component 12 adheres to the lower surface of the evaporator 110. In addition, the upper surface of the evaporator 110 adheres to a lower surface of the evaporator 310, an upper surface of the evaporator 310 adheres to the lower surface of the evaporator 210, and an upper surface of the evaporator 210 adheres to a lower surface of the evaporator 410.

Figure 22A:
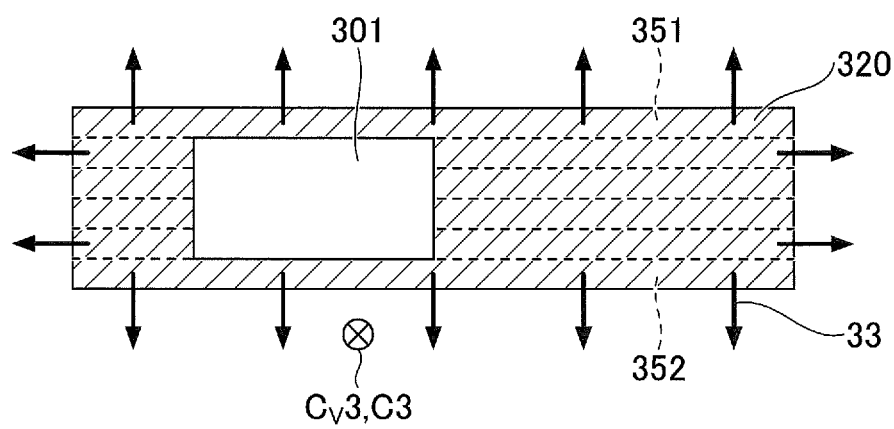
FIGS. 22A and 22B are cross sectional views illustrating the cooler according to the third embodiment.
Figure 22B:
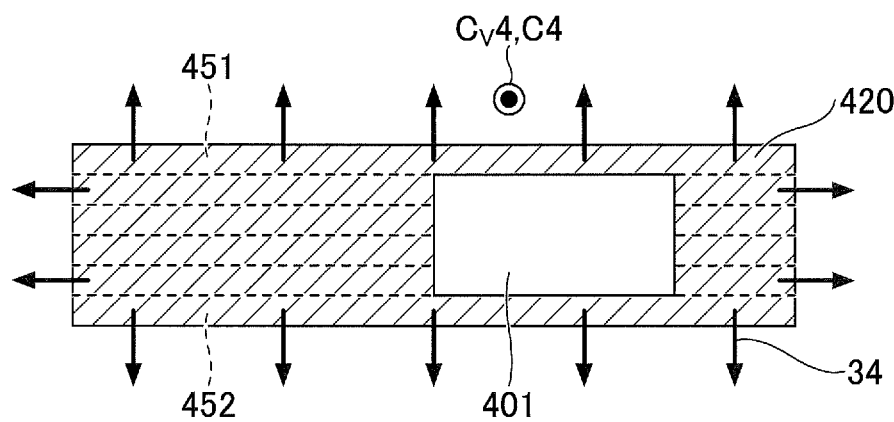

Next, the heat transfer in the cooler 3 will be described. FIG. 21, FIG. 22A, and FIG. 22B are cross sectional views illustrating the cooler according to the third embodiment. FIG. 21 corresponds to a cross sectional view along a line I-I in FIG. 17. FIG. 22A corresponds to a cross sectional view along a line II-II in FIG. 17. FIG. 22B corresponds to a cross sectional view along a line in FIG. 17.

As illustrated in FIG. 21, the evaporator 310 is provided with a space 360 in which the working fluid C3 in the liquid phase permeates into the porous body 350, and the vapor Cv3 in the vapor phase flows to the vapor pipe 330. Similarly, the evaporator 410 is provided with a space 460 in which the working fluid C4 in the liquid phase permeates into the porous body 450, and the vapor Cv4 in the vapor phase flows to the vapor pipe 430.

As illustrated in FIG. 21, the heat generated from the heat-generating component 12 is first transferred to the evaporator 110, as indicated by the bold arrow 17. When the heat is transferred to the evaporator 110, the working fluid C1 permeated into the porous body 150 inside the evaporator 110 vaporizes, to generate the vapor Cv1.

A part of the heat transferred to the evaporator 110 is used to generate the vapor Cv1, and another part of the heat is transferred to the evaporator 310, as indicated by the bold arrow 17. When the heat is transferred to the evaporator 310, the working fluid C3 permeated into the porous body 350 inside the evaporator 310 vaporizes, to generate the vapor Cv3.

A part of the heat transferred to the evaporator 310 is used to generate the vapor Cv3, and another part of the heat is transferred to the evaporator 210, as indicated by the bold arrow 17. When the heat is transferred to the evaporator 210, the working fluid C2 permeated into the porous body 250 inside the evaporator 210 vaporizes, to generate the vapor Cv2.

A part of the heat transferred to the evaporator 210 is used to generate the vapor Cv2, and another part of the heat is transferred to the evaporator 410, as indicated by the bold arrow 17. When the heat is transferred to the evaporator 410, the working fluid C4 permeated into the porous body 450 inside the evaporator 410 vaporizes, to generate the vapor Cv4.

As illustrated in FIG. 17 and FIG. 3A, the vapor Cv1 generated by the evaporator 110 is guided to the condenser 120 via the vapor pipe 130, and is liquefied by the condenser 120. When the vapor Cv1 is liquefied, the heat transferred by the vapor Cv1 is released to a periphery of the condenser 120, as indicated by the arrows 31 in FIG. 6A. Then, the working fluid C1 that is liquefied by the condenser 120 is guided to the evaporator 110 via the liquid pipe 140.

As illustrated in FIG. 17 and FIG. 19A, the vapor Cv3 generated by the evaporator 310 is guided to the condenser 320 via the vapor pipe 330, and is liquefied by the condenser 320. When the vapor Cv3 is liquefied, the heat transferred by the vapor Cv3 is released to a periphery of the condenser 320, as indicated by arrows 33 in FIG. 22A. Then, the working fluid C3 that is liquefied by the condenser 320 is guided to the evaporator 310 via the liquid pipe 340.

As illustrated in FIG. 17 and FIG. 3B, the vapor Cv2 generated by the evaporator 210 is guided to the condenser 220 via the vapor pipe 230, and is liquefied by the condenser 220. When the vapor Cv2 is liquefied, the heat transferred by the vapor Cv2 is released to the periphery of the condenser 120, as indicated by the arrows 32 in FIG. 6B. Then, the working fluid C2 that is liquefied by the condenser 220 is guided to the evaporator 210 via the liquid pipe 240.

As illustrated in FIG. 17 and FIG. 19B, the vapor Cv4 generated by the evaporator 410 is guided to the condenser 420 via the vapor pipe 430, and is liquefied by the condenser 420. When the vapor Cv4 is liquefied, the heat transferred by the vapor Cv4 is released to a periphery of the condenser 420, as indicated by arrows 34 in FIG. 22B. Then, the working fluid C4 that is liquefied by the condenser 420 is guided to the evaporator 410 via the liquid pipe 440.

In the cooler 3, the heat generated from the heat-generating component 12 is not only transferred to the condenser 120, but is also transferred to the condenser 220, the condenser 320, and the condenser 420. Accordingly, a good heat transfer performance can be obtained. Further, because the heat generated from the heat-generating component 12 is distributed to the loop heat pipes 100, 200, 300, and 400, the deformation of the loop heat pipe 100, for example, caused by the rise of the internal pressure, can be reduced or prevented according to the cooler 3, similar to the cooler 1.

In the cooler 3, when view from the mutually overlapping evaporators 110, 210, 310, and 410, the condensers 120, 220, 320, and 420 are positioned in all four directions, namely, the +X-direction, the −X-direction, the +Y-direction, and the −Y-direction. Accordingly, the heat transferred to the condenser 120, the heat transferred to the condenser 220 the heat transferred to the condenser 320, and the heat transferred to the condenser 420 uneasily interfere with one another. For this reason, the heat can be dissipated from the condensers 120, 220, 320, and 420 with a high efficiency.

The substances used for the working fluids C1, C2, C3, and C4 are not particularly limited, and the pressures within the loop-shaped passages 101, 201, 301, and 401 are not particularly limited. For example, the same substance may be used for the working fluids C1, C2, C3, and C4, and the pressures within the loop-shaped passages 101, 201, 301, and 401 may be made different. In this case, the pressure may be set to increase or decrease from the loop-shaped passage 101 toward the loop-shaped passage 401. In addition, mutually different substances may be used for the working fluids C1, C2, C3, and C4. In this case, the latent heat of vaporization may be set to increase or decrease from the working fluid C1 toward the working fluid C4. Further, the saturated vapor pressure in the main working temperature range of 50° C. to 100° C., for example, may be set to increase or decrease from the working fluid C1 towards the working fluid C4. Of course, the pressures within the loop-shaped passages 101, 201, 301, and 401 may be made different, and mutually different substances may be used for the working fluids C1, C2, C3, and C4.

In the third embodiment, the TIM 20 may be provided between the evaporators, similar to the modification of the first embodiment and the second embodiment. In addition, similar to the second embodiment, the space may be provided between the condensers 120, 220, 320, and 420, and the condensers 120, 220, 320, and 420 may be arranged to overlap in the plan view. Moreover, similar to the first modification of the second embodiment, the lower surface of the condenser 120 and the upper surface of the condensers 420 may contact the casing 50 having a thermal conductivity higher than the thermal conductivity of air. Furthermore, similar to the second modification of the second embodiment, the air flow 60 may be generated in the peripheries of the condensers 120, 220, 320, and 420 using a fan or the like.

The number of loop heat pipes included in the cooler is not limited to two or four, and may be three, or five or more.

Accordingly to each of the embodiments described above, the cooler can improve the heat transfer performance.

Although the embodiments and modifications are numbered with, for example, "first," "second," or "third," the ordinal numbers do not imply priorities of the embodiments and modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooler comprising:
    a plurality of loop heat pipes,
    wherein each of the plurality of loop heat pipes includes
        an evaporator configured to vaporize a working fluid,
        a condenser configured to liquefy the working fluid,
        a liquid pipe that connects the evaporator and the condenser, and
        a vapor pipe that connects the evaporator and the condenser, and forms a loop-shaped passage together with the liquid pipe,
    wherein evaporators of the plurality of loop heat pipes overlap each other, and
    wherein a pressure inside the loop-shaped passage is different among the plurality of loop heat pipes.

2. The cooler as claimed in claim 1, wherein a substance used for the working fluid that is sealed in the loop-shaped passage is different among the plurality of loop heat pipes.

3. The cooler as claimed in claim 1, wherein the evaporators of the plurality of loop heat pipes make direct contact with each other.

4. The cooler as claimed in claim 1, wherein the evaporators of the plurality of loop heat pipes overlap each other via a thermal interface material.

5. The cooler as claimed in claim 1, wherein a position of the condenser, in a plan view of the cooler, differs among the plurality of loop heat pipes.

6. The cooler as claimed in claim 2, wherein a position of the condenser, in a plan view of the cooler, differs among the plurality of loop heat pipes.

7. The cooler as claimed in claim 3, wherein a position of the condenser, in a plan view of the cooler, differs among the plurality of loop heat pipes.

8. The cooler as claimed in claim 4, wherein a position of the condenser, in a plan view of the cooler, differs among the plurality of loop heat pipes.

9. The cooler as claimed in claim 1, further comprising:
    a heat dissipating member contacting the condenser.

10. The cooler as claimed in claim 2, further comprising:
    a heat dissipating member contacting the condenser.

11. The cooler as claimed in claim 3, further comprising:
    a heat dissipating member contacting the condenser.

12. The cooler as claimed in claim 4, further comprising:
    a heat dissipating member contacting the condenser.

13. The cooler as claimed in claim 5, further comprising:
    a heat dissipating member contacting the condenser.

14. The cooler as claimed in claim 1, further comprising:
    a fan configured to generate an air flow in a periphery of the condenser.

15. The cooler as claimed in claim 2, further comprising:
    a fan configured to generate an air flow in a periphery of the condenser.

* * * * *